US012809487B2

(12) United States Patent
Yoo

(10) Patent No.: US 12,809,487 B2
(45) Date of Patent: Nov. 24, 2026

(54) SENSING PANEL, DISPLAY DEVICE INCLUDING THE SAME, AND ELECTRONIC DEVICE INCLUDING THE SAME

(71) Applicant: SAMSUNG DISPLAY CO., LTD., Yongin-si (KR)

(72) Inventor: Gi Na Yoo, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 19/042,057

(22) Filed: Jan. 31, 2025

(65) Prior Publication Data

US 2025/0390191 A1 Dec. 25, 2025

(30) Foreign Application Priority Data

Jun. 25, 2024 (KR) ........................ 10-2024-0082940

(51) Int. Cl.

| | |
|---|---|
| ***G06F 3/044*** | (2006.01) |
| ***H10H 29/34*** | (2025.01) |
| ***H10K 59/35*** | (2023.01) |

(52) U.S. Cl.

CPC ......... *G06F 3/0445* (2019.05); *H10H 29/345* (2025.01); *H10K 59/352* (2023.02); *G06F 2203/04111* (2013.01)

(58) Field of Classification Search

CPC .... G06F 3/0445; G06F 3/0446; G06F 3/0412; G06F 3/0448; G06F 3/0443; G06F 2203/04111; H10H 29/345; H10K 59/352

See application file for complete search history.

(56) References Cited

U.S. PATENT DOCUMENTS

| | | | | |
|---|---|---|---|---|
| 8,970,508 | B2 * | 3/2015 | An | G06F 3/0446 345/173 |
| 10,126,864 | B2 | 11/2018 | Jeong et al. | |
| 10,761,665 | B2 | 9/2020 | Park | |
| 11,561,656 | B2 | 1/2023 | Cho et al. | |
| 11,604,524 | B2 | 3/2023 | Kim et al. | |
| 11,995,280 | B2 | 5/2024 | Long | |
| 12,004,404 | B2 | 6/2024 | Park et al. | |
| 2012/0033168 | A1 | 2/2012 | Hwang et al. | |
| 2021/0191556 | A1 | 6/2021 | Lee et al. | |
| 2023/0259238 | A1 | 8/2023 | Kim et al. | |
| 2023/0393698 | A1 * | 12/2023 | Xiang | G06F 3/0446 |

FOREIGN PATENT DOCUMENTS

| | | | |
|---|---|---|---|
| CN | 114253427 | A | 3/2022 |
| KR | 10-2017-0131755 | A | 11/2017 |
| KR | 10-2019-0101517 | A | 9/2019 |
| KR | 10-2021-0105467 | A | 8/2021 |
| KR | 10-2536878 | B1 | 5/2023 |

* cited by examiner

*Primary Examiner* — Deeprose Subedi

(74) *Attorney, Agent, or Firm* — F. CHAU & ASSOCIATES, LLC

(57) ABSTRACT

A sensing panel includes a first insulating layer comprising a sensor base layer. A first conductive pattern layer is disposed on the sensor base layer and includes a bridge in an area connected to a contact portion. A second insulating layer is disposed on the first conductive pattern layer. A second conductive pattern layer is connected to the first conductive pattern layer in the contact portion and includes a valley bridge in an area where the second insulating layer is removed. A passivation layer covers the second conductive pattern layer.

25 Claims, 18 Drawing Sheets

SENSING PANEL, DISPLAY DEVICE INCLUDING THE SAME, AND ELECTRONIC DEVICE INCLUDING THE SAME

CROSS-REFERENCE TO RELATED APPLICATION

This application claims priority under 35 U.S.C. § 119 to Korean Patent Application No. 10-2024-0082940, filed on Jun. 25, 2024 in the Korean Intellectual Property Office, the disclosure of which is incorporated by reference in its entirety herein.

1. TECHNICAL FIELD

Embodiments of the present disclosure relate to a sensing panel, a display device including the same, and an electronic device including the same.

2. DISCUSSION OF RELATED ART

A display device is an electronic device that generates images and provides a connection medium between a user and information. Display devices have become increasingly important along with the advancement of the information society. Accordingly, the use of display devices such as a liquid crystal display device, an organic light emitting display device, and the like has been increasing.

The display device may include a display panel for displaying an image and a sensing panel for sensing an object. For example, the sensing panel may be used to determine a position of a touch input provided by a user.

However, the display device requires a structure to increase visibility. For example, interference between an optical path provided by the display device and a conductive structure forming the sensing panel should be reduced or prevented.

SUMMARY

An object of embodiments of the present disclosure is to provide a sensing panel with increased visibility and increased light emission efficiency, a display device including the same, and an electronic device including the same.

According to an embodiment of the present disclosure, a sensing panel includes a first insulating layer comprising a sensor base layer. A first conductive pattern layer is disposed on the sensor base layer and includes a bridge in an area connected to a contact portion. A second insulating layer is disposed on the first conductive pattern layer. A second conductive pattern layer is connected to the first conductive pattern layer in the contact portion and includes a valley bridge in an area where the second insulating layer is removed. A passivation layer covers the second conductive pattern layer.

In an embodiment, in an area where the valley bridge is disposed, the second conductive pattern layer may be in direct contact with an upper surface of the first insulating layer.

In an embodiment, a width of the valley bridge is a first bridge width, a width of the bridge is a second bridge width, and the first bridge width may be equal to the second bridge width.

In an embodiment, the passivation layer may cover the valley bridge, and the second insulating layer may cover the bridge.

In an embodiment, the second conductive pattern layer may comprise a first sensing electrode and a second sensing electrode that are electrically separated from each other, and the first conductive pattern layer may comprise the second sensing electrode.

In an embodiment, the first sensing electrode may include the valley bridge.

In an embodiment, the second sensing electrode may include the valley bridge.

According to an embodiment of the present disclosure, a display device includes a display panel including a first sub-pixel, a second sub-pixel, and a third sub-pixel. A sensing panel is disposed on the display panel. The sensing panel includes a first insulating layer comprising a sensor base layer. The first insulating layer is disposed on the display panel. A first conductive pattern layer is disposed on the sensor base layer and includes a bridge in an area connected to a contact portion. A second insulating layer is disposed on the first conductive pattern layer. A second conductive pattern layer is connected to the first conductive pattern layer in the contact portion and includes a valley bridge in an area where the second insulating layer is removed. A passivation layer covers the second conductive pattern layer.

In an embodiment, the first sub-pixel may emit red light, the second sub-pixel may emit green light, and the third sub-pixel may emit blue light; the first sub-pixel may be disposed adjacent to the second sub-pixel in a first direction; the third sub-pixel may be disposed adjacent to each of the first sub-pixel and the second sub-pixel in a second direction; and the first direction and the second direction may cross each other.

In an embodiment, the second conductive pattern layer may be disposed to entirely surround a peripheral area of each of the first sub-pixel, the second sub-pixel, and the third sub-pixel in a plan view.

In an embodiment, the first sub-pixel and the second sub-pixel may be alternately disposed in a first pixel column extending in the first direction, and the third sub-pixel may be disposed in a second pixel column disposed adjacent to the first pixel column in the second direction.

In an embodiment, the bridge may be disposed adjacent to the third sub-pixel in the first direction.

In an embodiment, the valley bridge is disposed adjacent to the third sub-pixel in the first direction.

In an embodiment, the valley bridge may be disposed between the first sub-pixel and the second sub-pixel in the first direction.

In an embodiment, the valley bridge may further extend in the second direction to be disposed adjacent to the third sub-pixel in the first direction.

In an embodiment, an area of the first sub-pixel may be less than areas of the second sub-pixel and the third sub-pixel in a plan view. The valley bridge may be disposed adjacent to the first sub-pixel in the first direction.

In an embodiment, the second conductive pattern layer may comprise a first sensing electrode and a second sensing electrode that are electrically separated from each other, and the first conductive pattern layer may comprise the second sensing electrode.

In an embodiment, the bridge may include a first bridge included in the first sensing electrode and including the second conductive pattern layer; and a second bridge included in the second sensing electrode and including the first conductive pattern layer. The first sensing electrode may include the first bridge; a (1-1)-th cell; and a (1-2)-th cell electrically connected to the (1-1)-th cell through the first bridge. The second sensing electrode may include the second bridge; a (2-1)-th cell; and a (2-2)-th cell electrically connected to the (2-1)-th cell through the second bridge.

In an embodiment, the valley bridge may be disposed to overlap the first bridge in a plan view.

In an embodiment, the valley bridge may be included in at least one of the (1-1)-th cell, the (1-2)-th cell, the (2-1)-th cell, and the (2-2)-th cell.

According to an embodiment of the present disclosure, an electronic device includes a display module including a bridge and a plurality of sub-pixels. The bridge is disposed between a first portion of the plurality of sub-pixels and includes a first conductive layer. A valley bridge is disposed between a second portion of the plurality of sub-pixels not including the first portion of the plurality of sub-pixels and includes a second conductive layer. A memory stores at least one instruction for detecting a touch input. A processor refers to the memory and detecting a touch position based on sensing data detected through the first conductive pattern layer and the second conductive pattern layer.

In an embodiment, the display module may include a display portion having the plurality of sub-pixels disposed therein. A sensor portion is disposed on the display portion and includes the first and second conductive layers.

In an embodiment, the plurality of sub-pixels may include a plurality of first sub-pixels emitting light in a red wavelength band, a plurality of second sub-pixels emitting light in a blue wavelength band, and a plurality of third sub-pixels emitting light in a green wavelength band, and the bridge may be disposed between a first portion of the plurality of second sub-pixels.

In an embodiment, the valley bridge may be disposed between a second portion of the plurality of second sub-pixels not including the first portion of the plurality of second sub-pixels.

In an embodiment, the valley bridge may be disposed between one of the plurality of first sub-pixels and one of the plurality of third sub-pixels.

In an embodiment, a bridge width of the bridge and a bridge width of the valley bridge may be equal to each other.

DETAILED DESCRIPTION OF EMBODIMENTS

Figure 1:
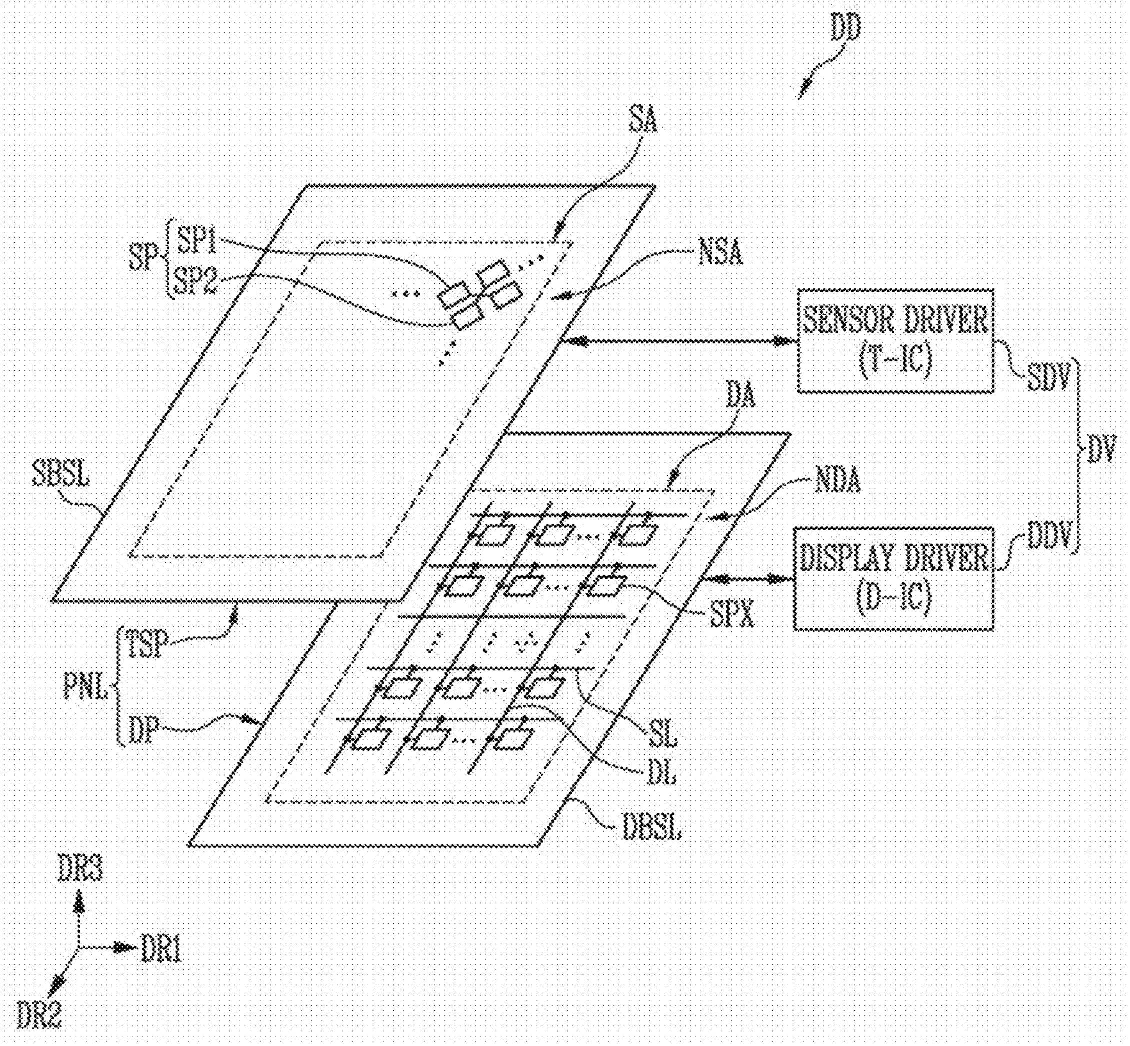
FIG. 1 is a schematic drawing for explaining a display device according to an embodiment of the present disclosure.

The present disclosure will be described more fully hereinafter with reference to the accompanying drawings, in which non-limiting embodiments of the present disclosure are shown. As those skilled in the art would realize, the described embodiments may be modified in various different ways, all without departing from the spirit or scope of the present disclosure.

To clearly describe the present disclosure, parts or portions that are irrelevant to the description may be omitted, and identical or similar constituent elements throughout the specification are denoted by the same reference numerals. Therefore, the above-mentioned reference numerals may be used in other drawings.

Further, in the drawings, the size and thickness of each element may be arbitrarily illustrated for ease of description, and embodiments of the present disclosure are not necessarily limited to those illustrated in the drawings. For example, in the drawings, the thicknesses of layers, films, panels, regions, areas, etc. may be exaggerated for clarity.

In addition, the expression "same" in the description may mean "substantially the same."

Terms such as first, second, and the like will be used only to describe various constituent elements, and are not to be interpreted as limiting these constituent elements. These terms are only used to differentiate one constituent element from another. For example, a first constituent element may be referred to as a second constituent element, and similarly, a second constituent element may be referred to as a first constituent element, without departing from the scope of embodiments of the present disclosure. Singular forms are intended to include plural forms unless the context clearly indicates otherwise.

Terms such as "below", "the lower side", "on", and "the upper side" are used to describe relationships or configurations of elements shown in the drawing. Such terms are understood to provide relative descriptions based on one or more directions shown in the drawing.

Unless otherwise defined, all terms (including technical and scientific terms) used herein have the same meaning as commonly understood by those skilled in the art to which the present disclosure belongs. In addition, terms should be interpreted as having meanings consistent with their meaning in the context of the related art or as defined in commonly used dictionaries, unless as explicitly defined here. Further, the terms should not be limited to being interpreted in an ideal or overly formal sense.

It should be understood that the term "include", "comprise", "have", or "configure" indicates that a feature, a number, a step, an operation, a constituent element, a part, or a combination thereof described in the specification is present, but does not exclude a possibility of presence or addition of one or more other features, numbers, steps, operations, constituent elements, parts, or combinations, in advance.

Hereinafter, embodiments of the present disclosure will be described in detail with reference to the accompanying drawings.

Figure 2:
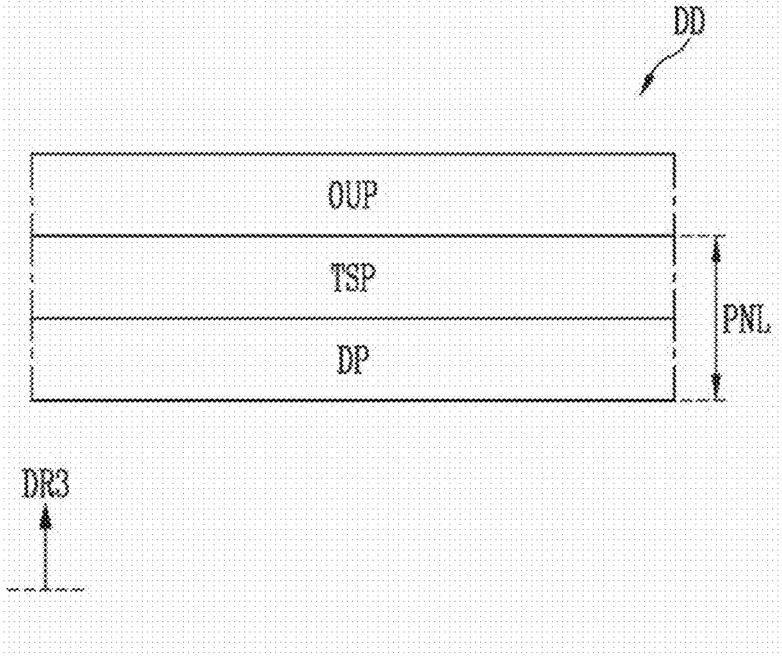
FIG. 2 illustrates a schematic cross-sectional view of a stacked structure of a display device according to an embodiment of the present disclosure.

FIG. 1 is a drawing for explaining a display device DD according to an embodiment. FIG. 2 illustrates a schematic cross-sectional view of a stacked structure of a display device DD according to an embodiment.

Referring to FIG. 1 and FIG. 2, the display device DD is configured to provide (e.g., emit) light. In an embodiment, the display device DD may include a panel PNL and a driving circuit DV for driving the panel PNL. The display device DD may further include an outer portion OUP.

The panel PNL may include a display portion DP for displaying an image and a sensor portion TSP capable of detecting a user input (e.g., a touch input, hover, etc.). The display portion DP may be referred to as a display panel. The sensor portion TSP may be referred to as a sensing panel TSP.

The panel PNL may include sub-pixels SPX and sensing electrodes SP. In some embodiments, the sub-pixels SPX may display an image in units of display frame periods. The sensing electrodes SP may sense a user input (e.g., a touch input) in units of a sensing frame period. The sensing frame period and the display frame period may be independent of each other, and may be different from each other or the same as each other. The sensing frame period and the display frame period may be synchronized with each other or may be asynchronized.

The sensor portion TSP including the sensing electrodes SP may obtain information about the user's touch input. According to an embodiment (e.g., a mutual capacitance method), the sensing electrodes SP may include a first sensing electrode SP1 that provides a first sensing signal and a second sensing electrode SP2 that provides a second sensing signal. In some embodiments, the first sensing electrode SP1 may be a transmitter (Tx) pattern electrode, and the second sensing electrode SP2 may be a receiver (Rx) pattern electrode. The information on the touch input (e.g., a touch event) may mean information including a position of a touch that the user wants to provide.

However, embodiments of the present disclosure are not necessarily limited thereto. For example, according to an embodiment (e.g., a self-capacitance method), the sensing electrodes SP may be configured of one type of sensing electrodes without distinction between the first sensing electrode SP1 and the second sensing electrode SP2.

In an embodiment, the driving circuit DV may include a display driver DDV for driving the display portion DP and a sensor driver SDV for driving the sensor portion TSP.

The display portion DP may include a display base layer DBSL and sub-pixels SPX provided on the display base layer DBSL. The sub-pixels SPX may be disposed in a display area DA.

The display base layer DBSL (e.g., the display device DD) may include a display area DA in which an image is displayed and a non-display area NDA outside the display area DA (e.g., in a plan view). In some embodiments, the display area DA may be disposed in the central area of the display portion DP, and the non-display area NDA may be disposed adjacent to the periphery of the display area DA (e.g., in a plan view).

The display base layer DBSL may be a base substrate or a base member for supporting the display device DD. In an embodiment, the display base layer DBSL may be a rigid substrate made of a glass material. Alternatively, the base layer may be a flexible substrate that is bendable, foldable, or rollable. In this embodiment, the display base layer DBSL may include an insulating material such as a polymer resin such as a polyimide (PI). However, embodiments of the present disclosure are not necessarily limited thereto.

Scan lines SL and data lines DL, and sub-pixels SPX connected to the scan lines SL and the data lines DL may be disposed in the display area DA. The sub-pixels SPX may be configured to be selected by a scan signal of a turn-on level supplied from the scan lines SL to receive a data signal from the data lines DL and to emit light with luminance corresponding to the data signal. Accordingly, an image corresponding to the data signal may be displayed in the display area DA.

Various wires connected to the sub-pixels SPX of the display area DA and/or internal circuit portions may be disposed in the non-display area NDA. For example, a plurality of wires for supplying various power and control signals to the display area DA may be disposed in the non-display area NDA.

The display portion DP may output visual information (e.g., an image). In some embodiments, the type/type of the display portion DP is not particularly limited. For example, in some embodiments the display portion DP may be implemented as a self-luminous display panel, such as an organic light emitting display panel. However, in an embodiment in which the display portion DP implemented as a self-light emitting type, each pixel is not necessarily limited to an embodiment in which only an organic light emitting element is included. For example, the light emitting element of each pixel may be formed as an organic light emitting diode, an inorganic light emitting diode, or a quantum dot/well light emitting diode. In some embodiments, the display portion DP may be implemented as a non-light emitting type of display panel such as a liquid crystal display panel. In an embodiment in which the display portion DP is implemented in a non-light emitting type, the display device DD may additionally include a light source such as a back-light unit.

Hereinafter, for better understanding and ease of description, the display portion DP will be described based on an embodiment in which it is implemented as an organic light emitting display panel. However, embodiments of the present disclosure are not necessarily limited thereto.

The sensor portion TSP includes a sensor base layer SBSL and a plurality of sensing electrodes SP formed on the sensor base layer SBSL. The sensing electrodes SP may be disposed in a sensing area SA on the sensor base layer SBSL.

The sensor base layer SBSL (e.g., the display device DD) may include a sensing area SA capable of sensing a touch input or the like, and a non-sensing area NSA around the sensing area SA (e.g., in a plan view). In some embodiments, the sensing area SA may be disposed to overlap at least one area of the display area DA. For example, in an embodiment the sensing area SA may be set as an area corresponding to the display area DA (e.g., an area overlapping the display area DA), and the peripheral area NSA may be set as an area corresponding to the non-display area NDA (e.g., an area overlapping the non-display area NDA). In this embodiment, when a touch input or the like is provided on the display area DA, it is possible to detect the touch input through the sensor portion TSP.

The sensor base layer SBSL may include one or more insulating layers. For example, the first insulating layer INS1 for forming the sensor base layer SBSL may be disposed on the display portion DP to form a base for forming the sensing electrodes SP. However, examples for forming the sensor base layer SBSL are not necessarily limited thereto.

The sensing area SA is an area capable of reacting to a touch input (e.g., an active area of a sensor). To this end, the sensing electrodes SP for sensing the touch input or the like may be disposed in the sensing area SA.

The sensor portion TSP may obtain information about an input provided from the user. The sensor portion TSP may recognize a touch input. In an embodiment, the sensor portion TSP may recognize the touch input by using a capacitive sensing method. Alternatively, the sensor portion TSP may sense the touch input by using a mutual capacitance method, or may sense the touch input by using a self-capacitance method.

In some embodiments, each of the first sensing electrodes SP1 may extend in the first direction DR1. The first sensing electrodes SP1 may be arranged in the second direction DR2. The second direction DR2 may cross the first direction DR1. For example, in an embodiment the second direction DR2 may be a direction orthogonal to the first direction DR1.

In some embodiments, each of the second sensing electrodes SP2 may extend in the second direction DR2. The second sensing electrodes SP2 may be arranged in the first direction DR1.

In some embodiments, the first sensing electrodes SP1 and the second sensing electrodes SP2 may have the same shape or substantially the same shape as each other. For example, the first sensing electrodes SP1 with the Tx pattern and the second sensing electrodes SP2 with the Rx pattern may have a corresponding shape or a substantially the same shape, and accordingly, the sensing performance of the touch event may be uniformly set within the sensing area SA.

In an embodiment, sensing lines for electrically connecting the sensing electrodes SP to the sensor driver SDV or the like may be disposed in the non-sensing area NSA of the sensor portion TSP.

The driving circuit DV may include a display driver DDV for driving the display portion DP and a sensor driver SDV for driving the sensor portion TSP.

The display driver DDV is configured to be electrically connected to the display portion DP to drive the sub-pixels SPX. The sensor driver SDV is configured to be electrically connected to the sensor portion TSP to drive the sensor portion TSP.

The outer portion OUP may be substantially disposed on an outer side of the display device DD. In an embodiment, the outer portion OUP may be disposed on the sensor portion TSP. Light provided from the display portion DP may pass through the outer portion OUP and be outputted to (e.g., transmitted to) the outside. In some embodiments, the outer portion OUP may include a window. In some embodiments, the outer portion OUTP may include a reflection adjustment layer RCL, a light blocking layer LBL, and the like, which will be described later with reference to FIG. 8. In some embodiments, the outer part OUTP may include color filters CF1, CF2, and CF3, which will be described later with reference to FIG. 9.

Figure 3:
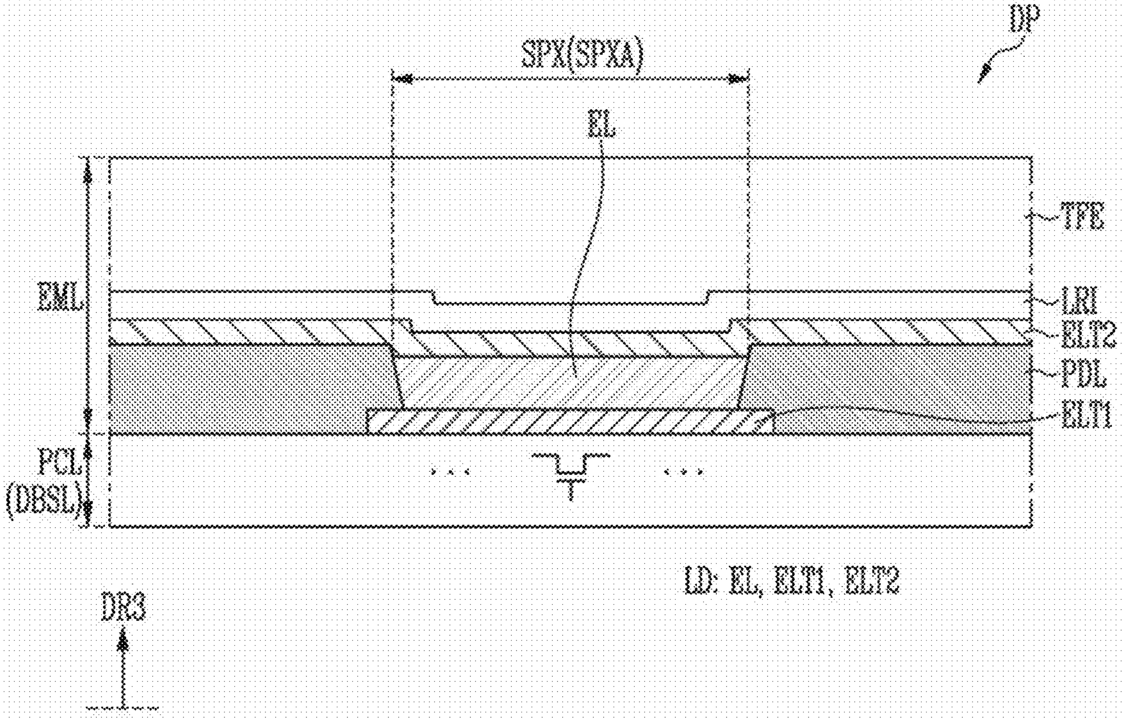
FIG. 3 illustrates a schematic cross-sectional view of a display portion according to an embodiment of the present disclosure.

FIG. 3 illustrates a schematic cross-sectional view of the display portion DP according to an embodiment.

Referring to FIG. 3, the display portion DP may include a pixel circuit layer PCL and a light emitting element layer LEL.

The pixel circuit layer PCL may include a pixel circuit for driving light emitting elements LD. In an embodiment, the pixel circuit layer PCL may include the display base layer DBSL, conductive layers for forming pixel circuits, and insulating layers disposed between the conductive layers.

The pixel circuit may include a switching element. The switching element may be implemented, for example, as a thin film transistor (TFT). The pixel circuit may include a driving transistor. The pixel circuit may be electrically connected to the light emitting elements LD to provide electrical signals for the light emitting elements LD to emit light.

A light emitting element layer EML may be disposed on a pixel circuit layer PCL. In some embodiments, the light emitting element layer EML may include a light emitting element LD, a pixel defining film PDL, a low-reflective inorganic layer LRI, an encapsulation film TFE, and the like.

The light emitting element LD may be disposed on the pixel circuit layer PCL. In some embodiments, the light emitting element LD may include a first electrode ELT1, a light emitting layer EL, and a second electrode ELT2. In some embodiments, the light emitting layer EL may be disposed in an area defined by the pixel defining film PDL. The pixel defining film PDL may be adjacent to the periphery of the light emitting layer EL. One surface (e.g., a lower surface in the third direction DR3) of the light emitting layer EL may be electrically connected to the first electrode ELT1, and the other surface (e.g., an upper surface in the third direction DR3) of the light emitting layer EL may be electrically connected to the second electrode ELT2.

The first electrode ELT1 may be an anode electrode for the light emitting layer EL, and the second electrode ELT2 may be a common electrode (e.g., a cathode electrode) for the light emitting layer EL. In some embodiments, the first electrode ELT1 and the second electrode ELT2 may include a conductive material. For example, the first electrode ELT1 may include a conductive material with reflective properties, and the second electrode ELT2 may include a transparent conductive material. However, embodiments of the present disclosure are not necessarily limited thereto.

The light emitting layer EL may have a multi-layered thin film structure including a light generation layer. In an embodiment, the light emitting layer EL may include a hole injection layer, a hole transport layer, a light generation layer, a hole blocking layer, an electron transport layer, an electron injection layer, and the like.

The hole injection layer may be configured to inject holes. The hole transport layer may be configured to have excellent hole transport properties and to suppress the movement of electrons that are not combined in the light generation layer to increase the opportunity for recombination of holes and electrons. The light generation layer may be configured to emit light by recombination of injected electrons and holes. The hole blocking layer may be configured to block the movement of holes that are not combined in the light generation layer. The electron transport layer may be configured to smoothly transport electrons to the light generation layer. The electron injection layer may be configured to inject electrons. The light emitting layer EL may emit light based on electrical signals provided from the first electrode ELT1 and the second electrode ELT2.

The light emitting layer EL may form a sub-pixel SPX. The light emitting layer EL may form a sub-pixel area SPXA from which light of one color (e.g., a predetermined color) is emitted. When viewed in a plan view, the area of the light emitting layer EL and the sub-pixel area SPXA may correspond to each other. For example, each light emitting layer EL may correspond to each sub-pixel area SPXA.

The pixel defining film PDL may be disposed on the pixel circuit layer PCL to define a position at which the light emitting layer EL is disposed. The pixel defining film PDL may include an organic material. In some embodiments, the pixel defining film PDL may include one or more of an acrylic resin, an epoxy resin, a phenol resin, a polyamide resin, and a polyimide resin. However, embodiments of the present disclosure are not necessarily limited thereto. For example, the pixel defining film PDL may include an inorganic material.

The low-reflective inorganic layer LRI may be disposed on the light emitting element LD (e.g., the second electrode ELT2). The low reflective inorganic layer LRI may be disposed between the encapsulation film TFE and the light emitting element LD (e.g., in the third direction DR3).

The low reflective inorganic layer LRI may include an inorganic material. For example, the low reflective inorganic layer LRI may include one or more of a metal or a metal compound in consideration of a refractive index and an absorption coefficient. The low reflective inorganic layer LRI may absorb light incident into the display device DD from the outside (e.g., the external environment), and may reduce the reflectance of external light of the display device DD. Accordingly, the low reflective inorganic layer LRI is included, so that display quality and visibility of the display device DD may be increased.

The encapsulation film TFE may be disposed on the low reflective inorganic layer LRI. The encapsulation film TFE may offset a level difference (e.g., in the third direction DR3) generated by the light emitting element LD, the low reflective inorganic layer LRI, and the pixel defining film PDL. The encapsulation film TFE may include a plurality of insulating films covering the light emitting element LD. In some embodiments, the encapsulation film TFE may have a structure including at least one inorganic film and an organic film.

Figure 4:
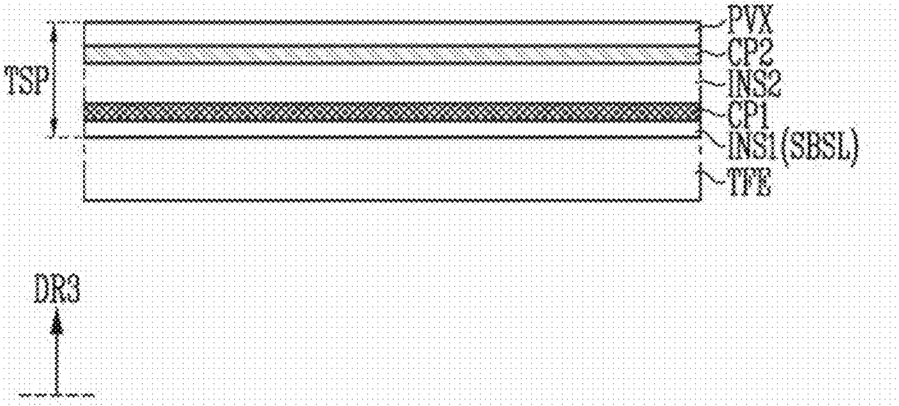
FIG. 4 illustrates a schematic cross-sectional view of a sensor portion according to an embodiment of the present disclosure.
Figure 5:
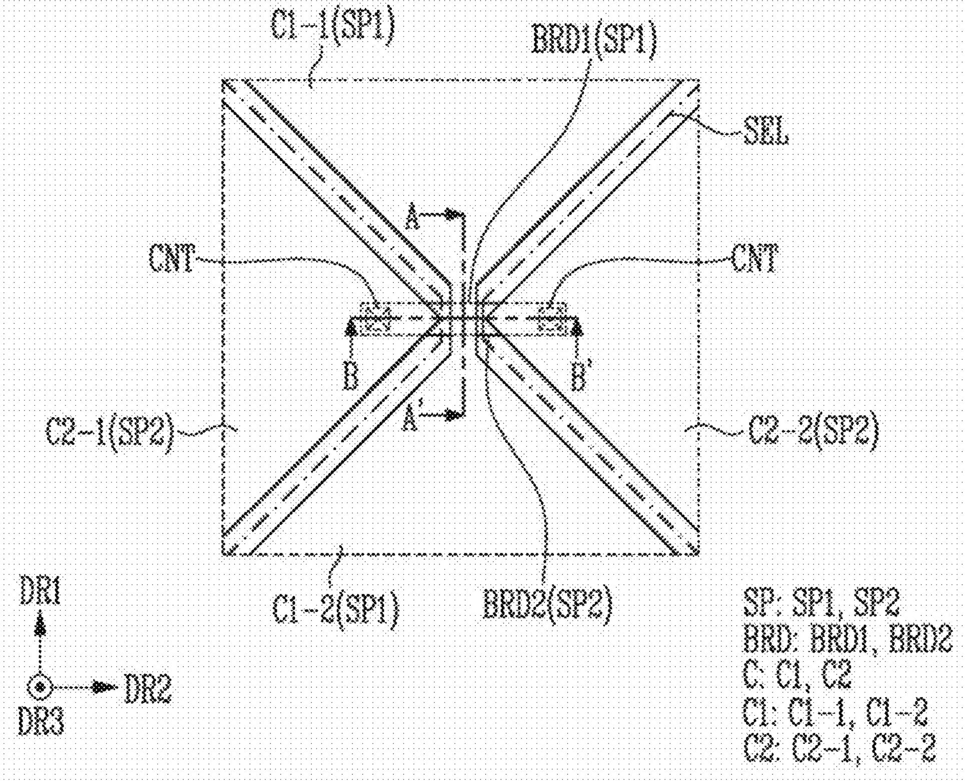
FIG. 5 and FIG. 6 illustrate schematic top plan views of sensing electrodes according to embodiments of the present disclosure.
Figure 6:
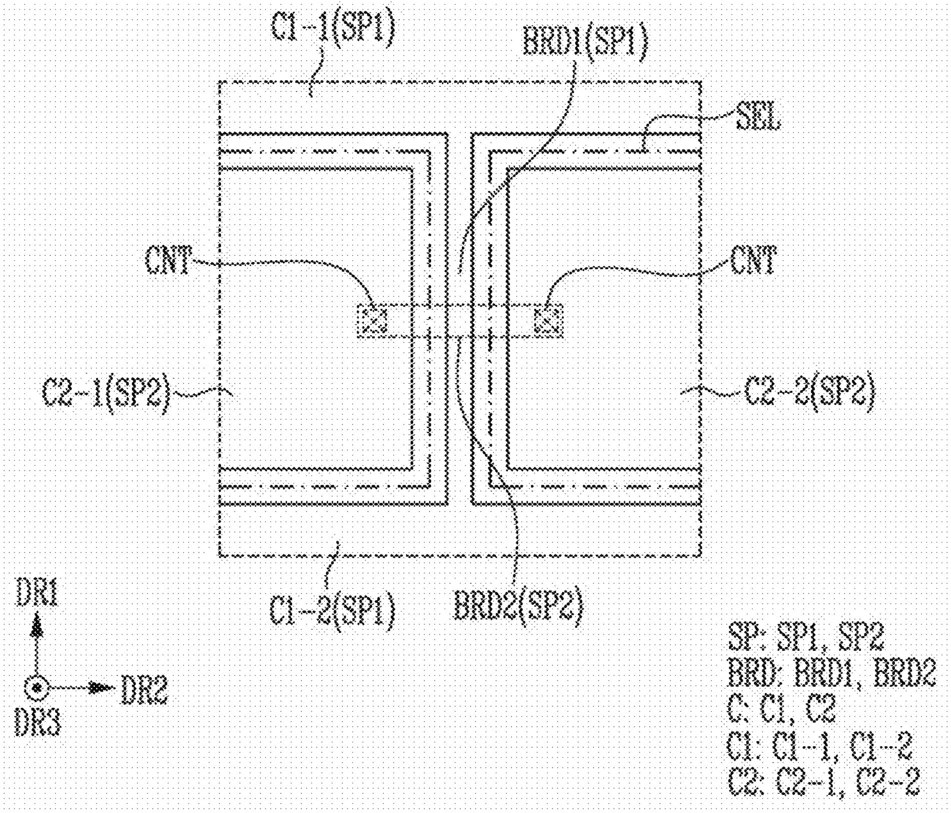

FIG. 4 illustrates a schematic cross-sectional view of a sensor portion TSP according to an embodiment. FIG. 5 and FIG. 6 illustrate schematic top plan views of sensing electrodes SP according to an embodiment.

Referring to FIG. 4 to FIG. 7, the sensor portion TSP may be disposed on the encapsulation film TFE (e.g., disposed directly thereon in the third direction DR3). In an embodiment, the sensor portion TSP may include a first insulating layer INS1, a first conductive pattern layer CP1, a second insulating layer INS2, a second conductive pattern layer CP2, and a passivation layer PVX.

In some embodiments, the first conductive pattern layer CP1 and the second conductive pattern layer CP2 may be patterned in one area to form the sensing electrodes SP. For example, a portion of the first conductive pattern layer CP1 may configure (e.g., comprise) the first sensing electrode SP1, and a portion of each of the first conductive pattern layer CP1 and the second conductive pattern layer CP2 may configure (e.g., comprise) the second sensing electrode SP2. However, embodiments of the present disclosure are not necessarily limited thereto. For example, in an embodiment a portion of the second conductive pattern layer CP2 may configure (e.g., comprise) the first sensing electrode SP1, and a portion of each of the first conductive pattern layer CP1 and the second conductive pattern layer CP2 may configure (e.g., comprise) the second sensing electrode SP2. However, embodiments of the present disclosure are not necessarily limited thereto.

The first insulating layer INS1 may be disposed on the encapsulation film TFE (e.g., disposed directly thereon in the third direction DR3). In an embodiment, the first insulating layer INS1 may form the sensor base layer SBSL to provide an area in which the first conductive pattern layer CP1, the second insulating layer INS2, the second conductive pattern layer CP2, and the passivation layer PVX are disposed.

The first conductive pattern layer CP1 may be disposed on the first insulating layer INS1 (e.g., disposed directly thereon in the third direction DR3). The second conductive pattern layer CP2 may be disposed on the second insulating layer INS2 (e.g., disposed directly thereon in the third direction DR3). The first conductive pattern layer CP1 and the second conductive pattern layer CP2 may be spaced apart from each other (e.g., in the third direction DR3) with the second insulating layer INS2 therebetween.

The first conductive pattern layer CP1 and the second conductive pattern layer CP2 may include a single-layered or multi-layered metal layer. For example, in an embodiment the first conductive pattern layer CP1 and the second conductive pattern layer CP2 may include at least one of various metallic materials such as gold (Au), silver (Ag), aluminum (Al), molybdenum (Mo), chromium (Cr), titanium (Ti), nickel (Ni), neodymium (Nd), copper (Cu), and platinum (Pt), or an alloy thereof. In some embodiments, the first conductive pattern layer CP1 and the second conductive pattern layer CP2 may include at least one of various transparent conductive materials including one of a silver nanowire (AgNW), an indium tin oxide (ITO), an indium zinc oxide (IZO), an indium gallium zinc oxide (IGZO), an antimony zinc oxide (AZO), an indium tin zinc oxide (ITZO), a zinc oxide (ZnO), a tin oxide ($SnO_2$), a carbon nano tube, and a graphene.

The second insulating layer INS2 may be disposed on the first conductive pattern layer CP1 (e.g., disposed directly thereon in the third direction DR3). The second insulating layer INS2 may be interposed between the first conductive pattern layer CP1 and the second conductive pattern layer CP2 (e.g., in the third direction DR3). The passivation layer PVX may be disposed on the second conductive pattern layer CP2 (e.g., disposed directly thereon in the third direction DR3).

The first insulating layer INS1 may include one or more of an inorganic material and an organic material. The second insulating layer INS2 may include one or more of an inorganic material and an organic material. In some embodiments, the passivation layer PVX may include an organic material. In an embodiment, the inorganic material may include one or more of the group consisting of a silicon nitride ($SiN_x$), a silicon oxide ($SiO_x$), a silicon oxynitride ($SiO_xN_y$), and an aluminum oxide ($AlO_x$). The organic material may include one or more of an acrylic resin, an epoxy resin, a phenol resin, a polyamide resin, and a polyimide resin. However, embodiments of the present disclosure are not necessarily limited thereto.

In some embodiments in which the second insulating layer INS2 includes an organic material, a short-circuit risk between the first conductive pattern layer CP1 and the second conductive pattern layer CP2 may be reduced. Accordingly, even if the thickness of at least one or more of the first conductive pattern layer CP1 and the second conductive pattern layer CP2 is increased, the structural risk may be reduced. Thus, the degree of freedom in process design may be increased.

The sensing electrodes SP may include a cell (C) and a bridge BRD. The cell (C) may have a relatively large area, and the bridge BRD may have a relatively small area. The cells (C) adjacent to each other may be electrically connected by the bridge BRD. In an embodiment, the cell C may include a first cell C1 and a second cell C2. The bridge BRD may include a first bridge BRD1 and a second bridge BRD2.

In some embodiments, the first cell C1 and the second cell C2 may be formed by the second conductive pattern layer CP2. The first bridge BRD1 may be formed by the second conductive pattern layer CP2. For example, in an embodiment one portion (e.g., a first portion) of the second bridge BRD2 may be formed by the first conductive pattern layer CP1, and the other portion (e.g., a second portion) of the second bridge BRD2 may be formed by the second conductive pattern layer CP2.

However, embodiments of the present disclosure are not necessarily limited thereto. For example, in an embodiment the first cell C1 and the second cell C2 may be formed by the first conductive pattern layer CP1. The first bridge BRD1 may be formed by the first conductive pattern layer CP1. One portion of the second bridge BRD2 may be formed by the second conductive pattern layer CP2, and the other portion of the second bridge BRD2 may be formed by the first conductive pattern layer CP1.

In some embodiments, the sensing electrodes SP may have a mesh structure. The cells C and the bridges BRD may have a mesh structure. For example, in an embodiment the second conductive pattern layer CP2 for forming the sensing electrodes SP may be patterned according to the mesh structure. Since the sensing electrodes SP have a mesh structure, the capacitance that may form with other electrodes disposed at the lower portion of the cells C may be reduced.

The first sensing electrode SP1 may have a structure in which the first cells C1 having a relatively large area and the first bridge BRD1 having a relatively narrow area are connected to each other. For example, in an embodiment the first cell C1 may include a (1-1)-th cell C1-1 and a (1-2)-th cell C1-2, and the first bridge BRD1 may electrically connect the (1-1)-th cell C1-1 and the (1-2)-th cell C1-2 to each other.

The second sensing electrode SP2 may have a structure in which the second cells C2 having a relatively large area and the second bridge BRD2 having a relatively narrow area are connected to each other. For example, in an embodiment the second cell C2 may include a (2-1)-th cell C2-1 and a (2-2)-th cell C2-2, and the second bridge BRD2 may electrically connect the (2-1)-th cell C2-1 and the (2-2)-th cell C2-2 to each other.

In some embodiments, the second bridge BRD2 may be electrically connected to the (2-1)-th cell C2-1 through one contact portion CNT, and may be electrically connected to the (2-2)-th cell C2-2 through the other contact portion CNT. Accordingly, the second bridge BRD2 disposed on a different layer from the second cell C2 may electrically connect the (2-1)-th cell C2- and the (2-2)-th cell C2-2 to each other through the contact portion CNT. In some embodiments, the contact portion CNT may penetrate the second insulating layer INS2.

Referring to FIG. 5, the first cell C1 and the second cell C2 may substantially have a diamond shape (e.g., in a plan view). However, embodiments of the present disclosure are not necessarily limited thereto and the shapes of the first cell C1 and the second cell C2 may vary. For example, referring to FIG. 6, the first cell C1 and the second cell C2 may substantially have a quadrangular shape (e.g., in a plan view).

The first sensing electrodes SP1 and the second sensing electrodes SP2 may be adjacent to each other with a separation line SEL therebetween. The separation line SEL may be a virtual line disposed in the area between the first sensing electrodes SP1 and the second sensing electrodes SP2. For example, the separation line SEL may be disposed between the (1-1)-th cell C1-1 and (1-2)-th cell C1-2. The separation line SEL may be disposed between the first bridge BRD1 and the (1-2)-th cell C1-2.

Figure 7:
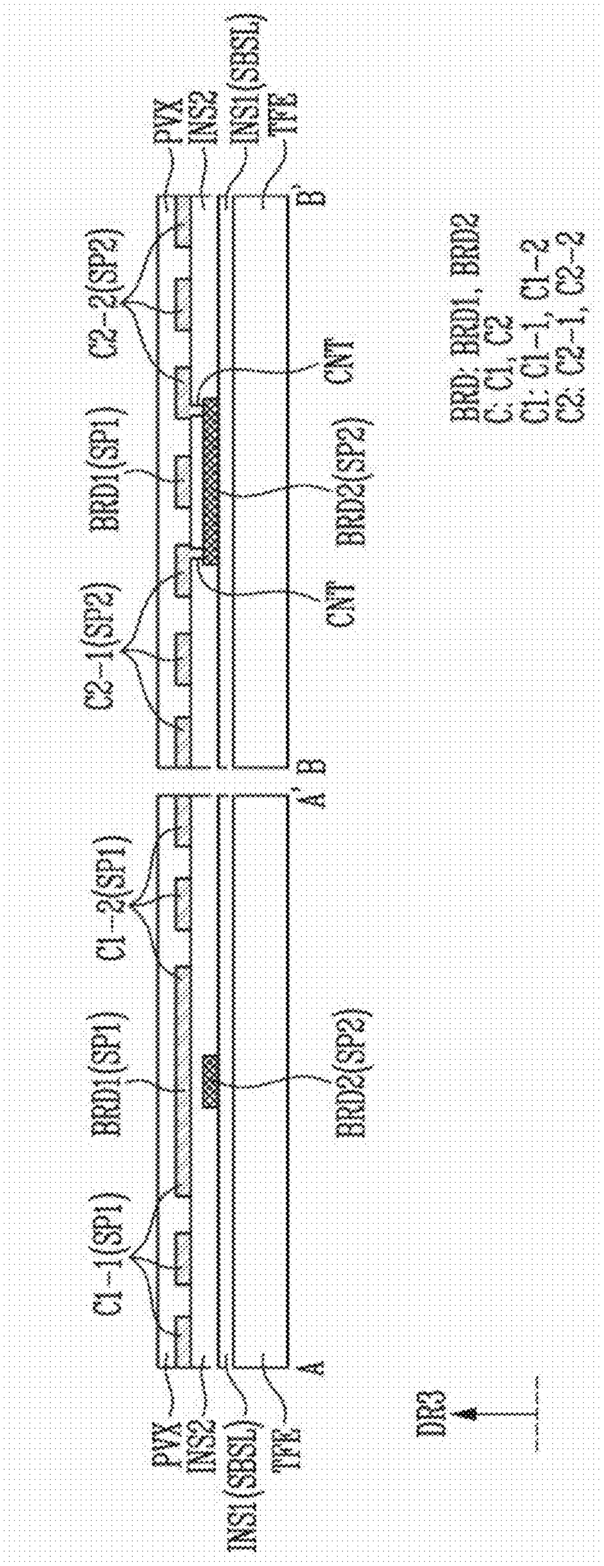
FIG. 7 illustrates a cross-sectional view taken along line A-A' of FIG. 5 and a cross-sectional view taken along line B-B' of FIG. 5 according to an embodiment of the present disclosure.

FIG. 7 illustrates a cross-sectional view taken along line A-A' of FIG. 5 and a cross-sectional view taken along line B-B' of FIG. 5.

The cross-sectional view taken along line A-A' and the cross-sectional view taken along line B-B' may correspond to an embodiment in which the first cell C1 and the second cell C2 each have a mesh shape.

In the cross-sectional view taken along line A-A', the first bridge BRD1 of the first sensing electrode SP1 may be configured to electrically connect the (1-1)-th cell C1-1 and the (1-2)-th cell C1-2 to each other. In an embodiment, the first bridge BRD1 may be disposed to be spaced apart from the second bridge BRD2 disposed therebelow with the second insulating layer INS2 interposed therebetween (e.g., in the third direction DR3).

In the cross-sectional view taken along line B-B', the second bridge BRD2 of the second sensing electrode SP2 may be connected to the (2-1)-th cell C2-1 and the (2-2)-th cell C2-2 disposed on the second insulating layer INS2 through the contact portion CNT. In an embodiment, the second bridge BRD2 may be disposed to be spaced apart from the first bridge BRD1 disposed thereabove with the second insulating layer INS2 interposed therebetween (e.g., in the third direction DR3).

Figure 8:
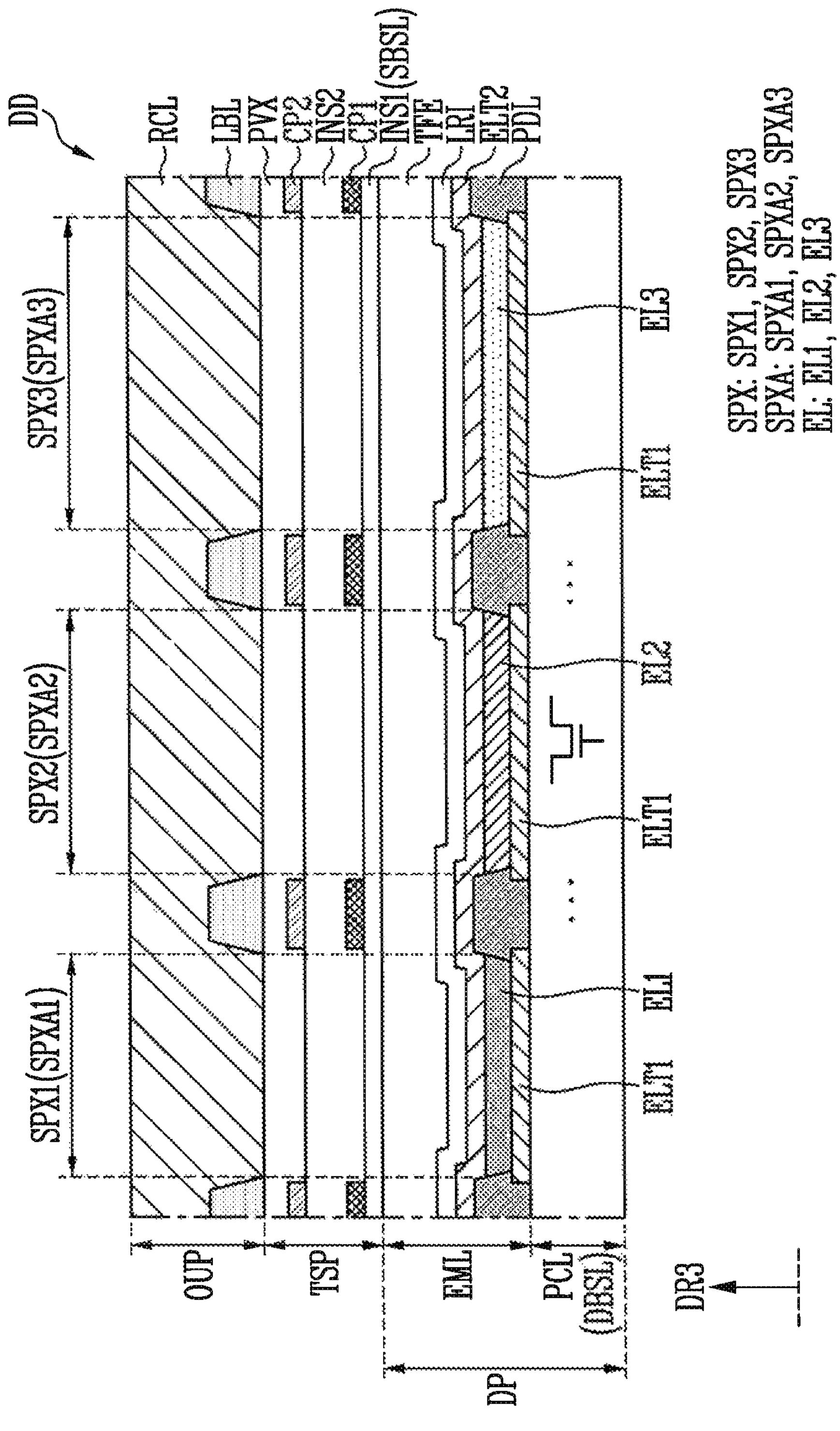
FIG. 8 and FIG. 9 illustrate schematic cross-sectional views of a display device according to embodiments of the present disclosure.
Figure 9:
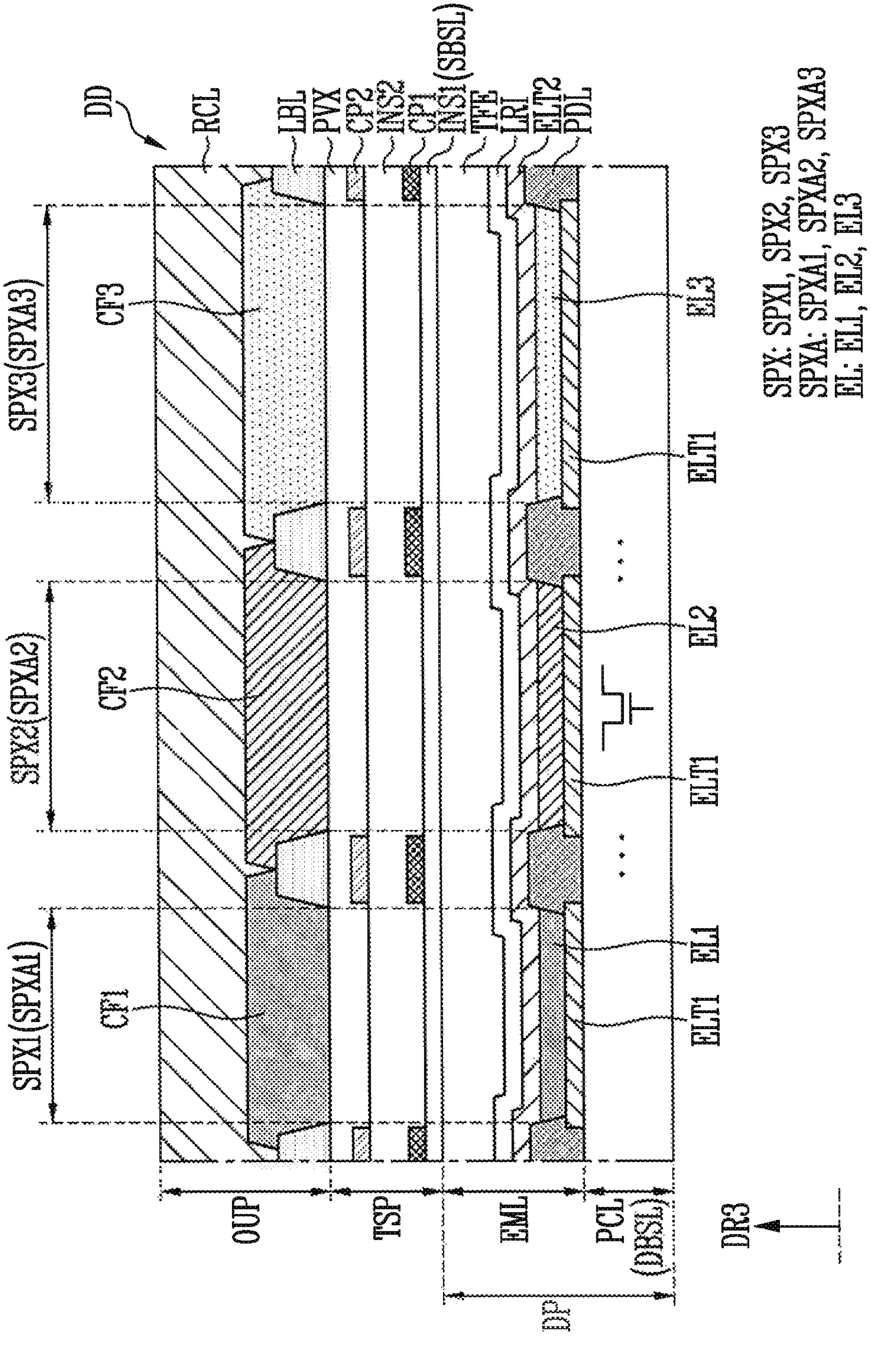

FIG. 8 and FIG. 9 illustrate schematic cross-sectional views of the display device DD according to embodiments of the present disclosure.

Referring to FIG. 8, the light emitting layer EL may include a first light emitting layer EL1 included in the first sub-pixel SPX1, a second light emitting layer EL2 included in the second sub-pixel SPX2, and a third light emitting layer EL3 included in the third sub-pixel SPX3. The first light emitting layer EL1 may emit light of a first color (e.g., red color in a red wavelength band) and may form a first sub-pixel area SPXA1. The second light emitting layer EL2 may emit light of a second color (e.g., green color in a green wavelength band) and may form a second sub-pixel area SPXA2. The third light emitting layer EL3 may emit light of a third color (e.g., blue color in a blue wavelength band) and may form a third sub-pixel area SPXA3.

In the sensor portion TSP, the first conductive pattern layer CP1 and the second conductive pattern layer CP2 may be disposed on different layers from each other to form the sensing electrodes SP.

The outer portion OUP may be disposed on the sensor portion TSP (e.g., in the third direction DR3). In an embodiment, the outer portion OUP may include a light blocking layer LBL, a reflection adjustment layer RCL, and the like.

The light blocking layer LBL may overlap the first conductive pattern layer CP1 and/or the second conductive pattern layer CP2 when viewed in a plan view (e.g., viewed from an upper surface). In an embodiment, the light blocking layer LBL may include a light blocking material. However, embodiments of the present disclosure are not necessarily limited thereto.

The reflection adjustment layer RCL may selectively absorb light in one wavelength range to control the reflectance and color of the display device DD. In some embodiments, the reflection adjustment layer RCL may include a dye, a pigment, or a combination thereof. For example, the reflection adjustment layer RCL may include one or more of an oxazine-based compound, a cyanine-based compound, a tetraazoporphine-based compound, and a squaryllium-based compound. However, embodiments of the present disclosure are not necessarily limited thereto.

In some embodiments, sizes (e.g., areas) of the sub-pixel areas SPXA may be different from each other (e.g., in a plan view). Respective areas of the first sub-pixel area SPXA1, the second sub-pixel area SPXA2, and the third sub-pixel area SPXA3 may be different from each other. For example, in an embodiment the area of the third sub-pixel area SPXA3 may be larger than that of the second sub-pixel area SPXA2. The area of the second sub-pixel area SPXA2 may be larger than that of the first sub-pixel area SPXA1. However, embodiments of the present disclosure are not necessarily limited thereto. In some embodiments, the area of the second sub-pixel area SPXA2 may be the same as the of the first sub-pixel SPXA1. Hereinafter, for better understanding and ease of description, an embodiment in which the area of the second sub-pixel area SPXA2 is larger than that of the first sub-pixel area SPXA1 will be described.

In some embodiments, by manufacturing partial areas of the sub-pixel area SPXA differently, the luminous efficiency deviation for each color of the sub-pixel SPX may be compensated.

In some embodiments, referring to FIG. 9, the outer portion OUTP may further include color filters CF1, CF2, and CF3. In some embodiments, a full-color image may be displayed by disposing the color filters CF1, CF2, and CF3 matching respective colors of the first to third sub-pixels SPX1, SPX2, and SPX3.

The first color filter CF1 is a color filter for forming the first sub-pixel SPX1, and may overlap the first sub-pixel area SPXA1 when viewed in a plan view. The first color filter CF1 may selectively transmit light of a first color. For example, in an embodiment the first color filter CF1 is a red color filter and may include a red color filter material.

The second color filter CF2 is a color filter for forming the second sub-pixel SPX2, and may overlap the second sub-pixel area SPXA2 when viewed in a plan view. The second color filter CF2 may selectively transmit light of a second color. For example, in an embodiment the second color filter CF2 is a green color filter and may include a green color filter material.

The third color filter CF3 is a color filter for forming the third sub-pixel SPX3, and may overlap the third sub-pixel area SPXA3 when viewed in a plan view. The third color filter CF3 may selectively transmit light of a third color. For example, in an embodiment the third color filter CF3 is a blue color filter and may include a blue color filter material.

The cross-sectional structure of the display device DD according to an embodiment of the present disclosure is not necessarily limited to the above-described embodiment.

Figure 10:
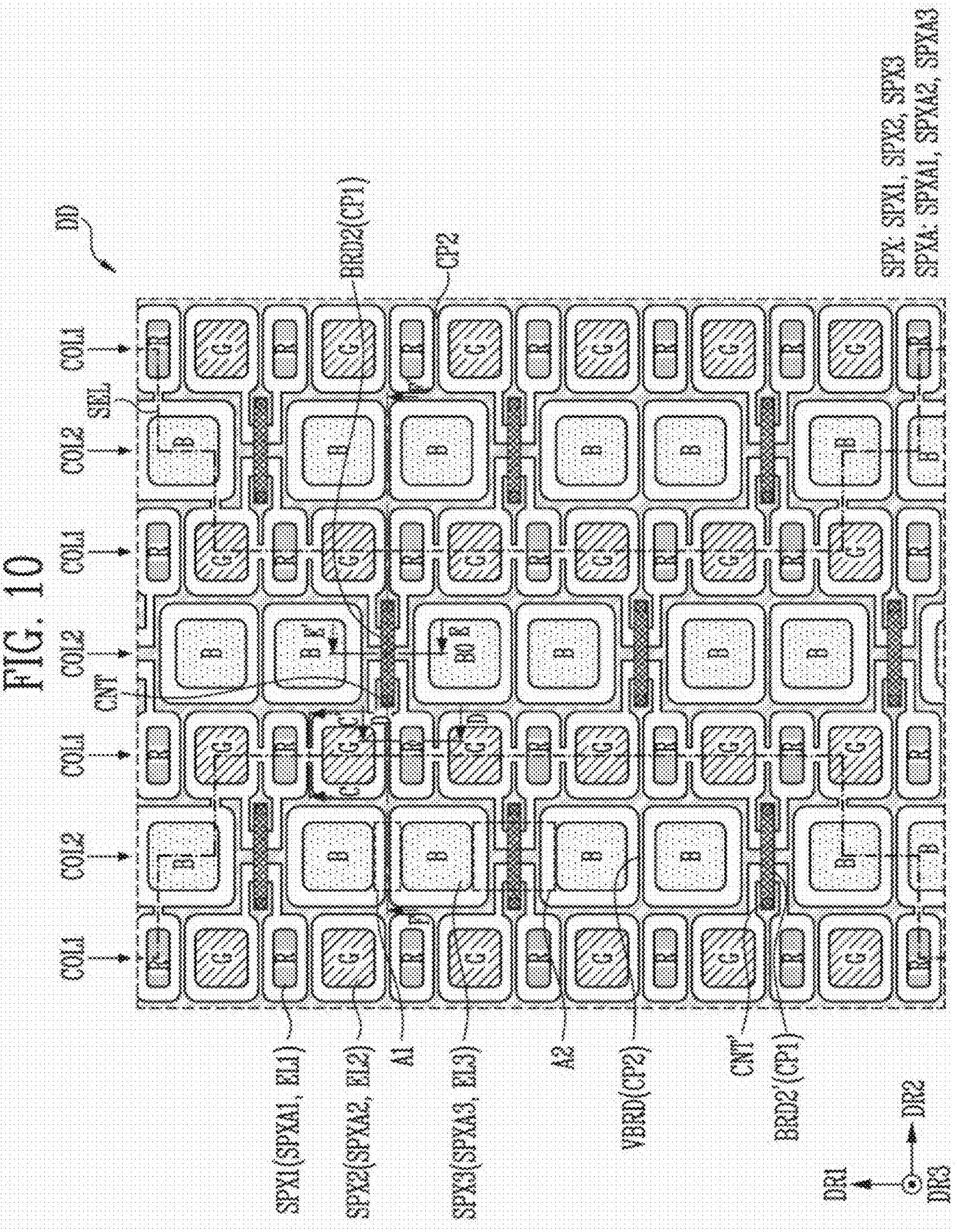
FIG. 10 and FIG. 11 illustrate schematic top plan views of a display device according to embodiments of the present disclosure.
Figure 11:
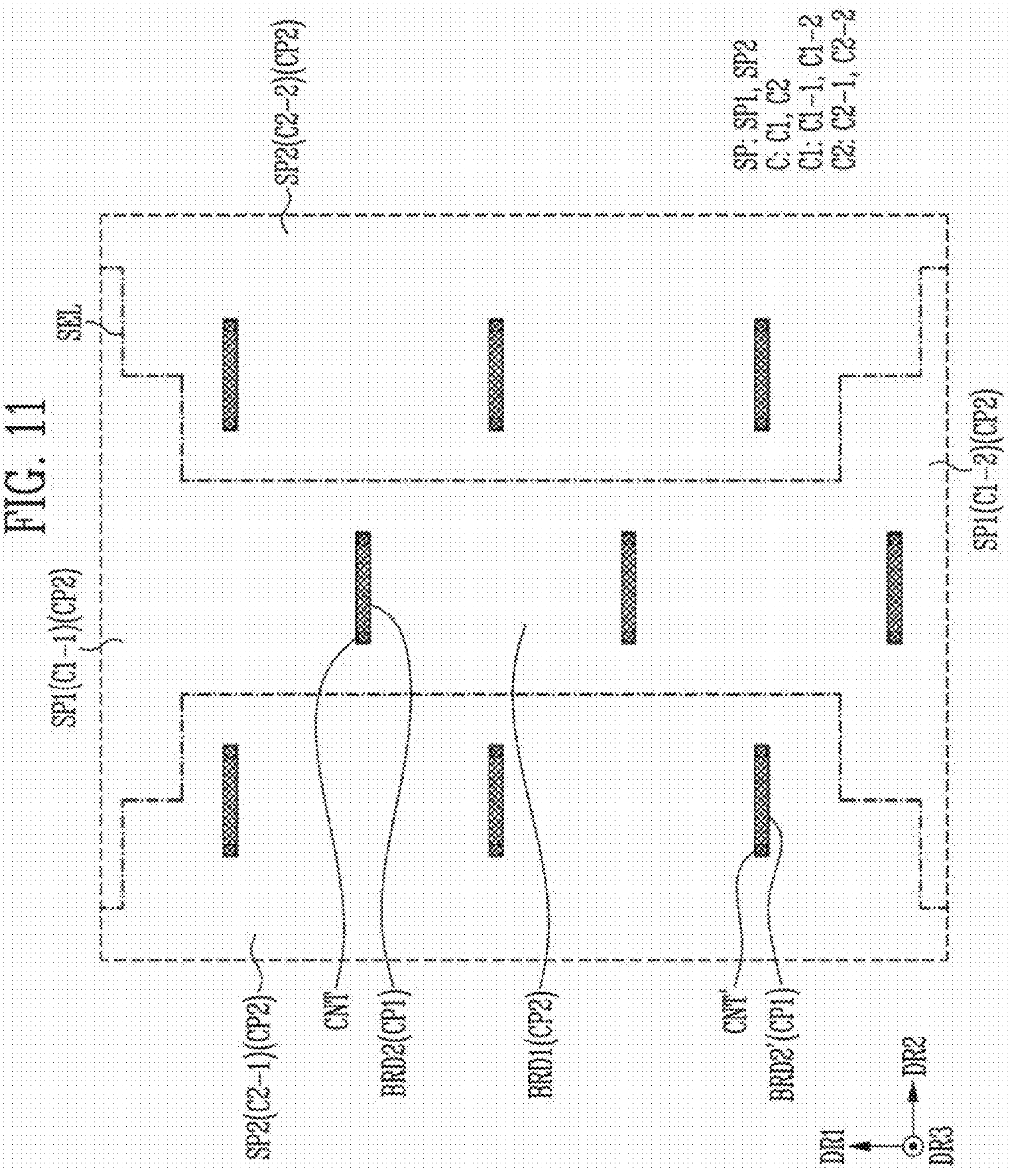
Figure 12:
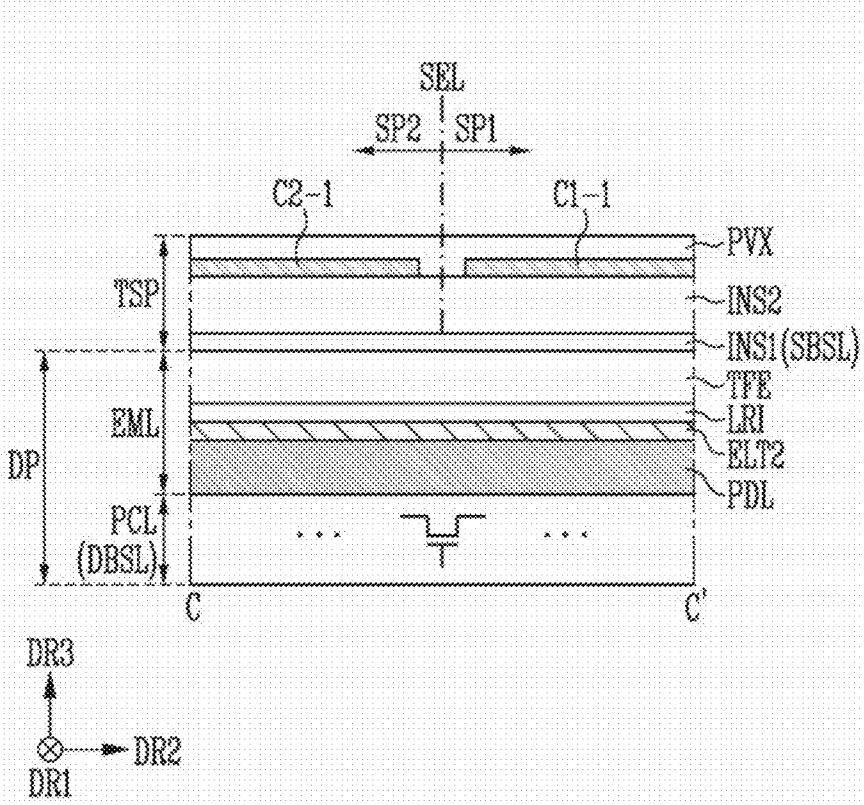
FIG. 12 illustrates a cross-sectional view taken along line C-C' of the display device of FIG. 10 according to an embodiment of the present disclosure.
Figure 13:
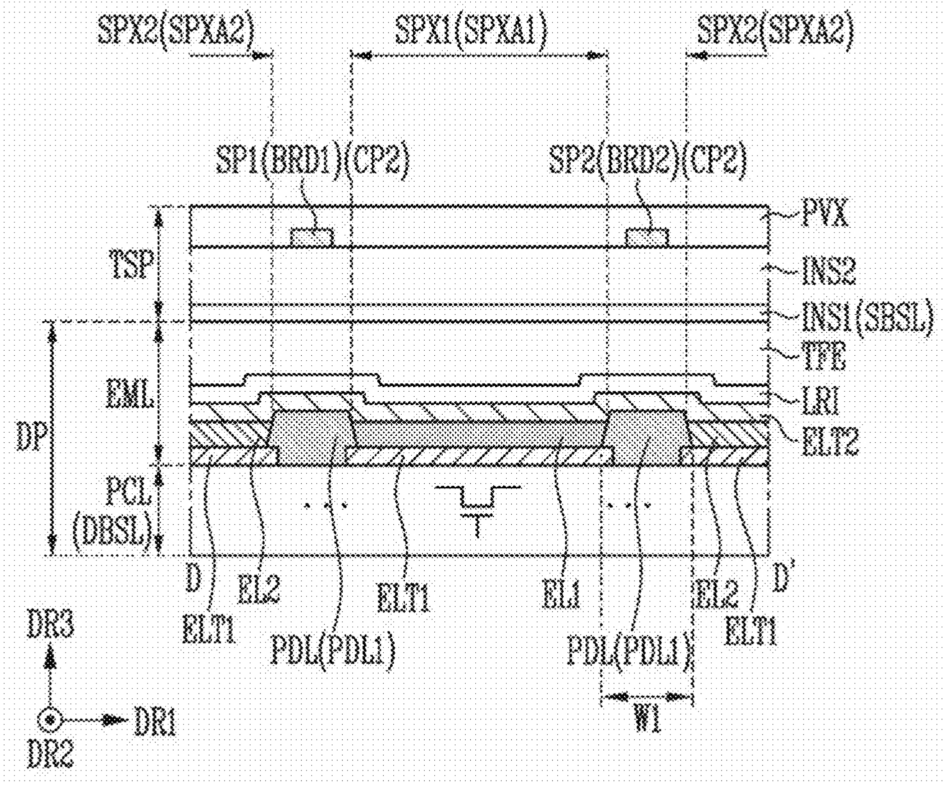
FIG. 13 illustrates a cross-sectional view taken along line D-D' of the display device of FIG. 10 according to an embodiment of the present disclosure.
Figure 14:
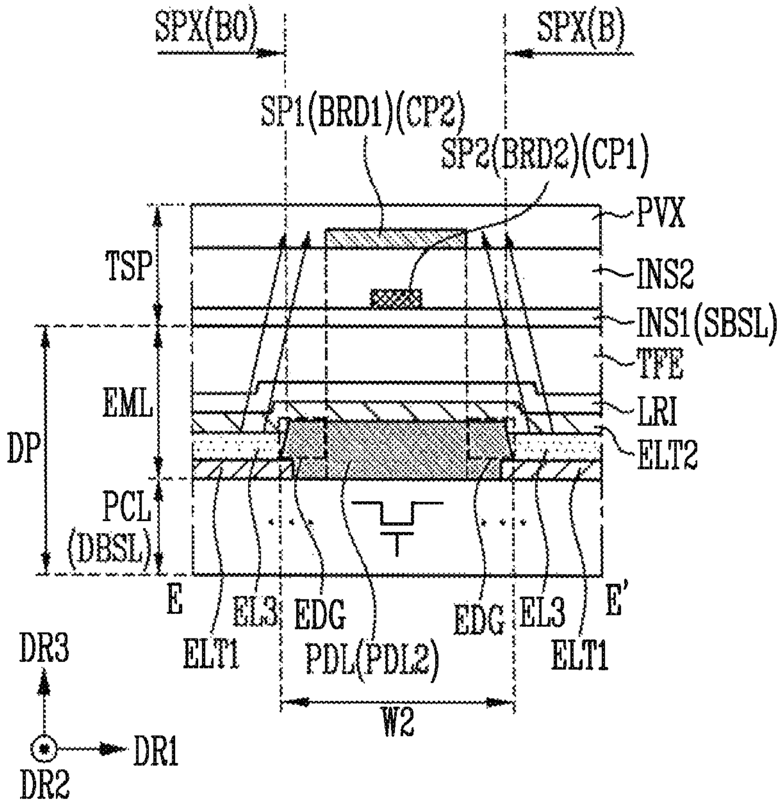
FIG. 14 illustrates a cross-sectional view taken along line E-E' of the display device of FIG. 10 according to an embodiment of the present disclosure.

FIG. 10 and FIG. 11 illustrate schematic top plan views of a display device according to embodiments of the present disclosure. FIG. 12 illustrates a cross-sectional view taken along line C-C' of the display device of FIG. 10. FIG. 13 illustrates a cross-sectional view taken along line D-D' of the display device of FIG. 10. FIG. 14 illustrates a cross-sectional view taken along line E-E' of the display device of FIG. 10. FIG. 13 illustrates a cross-sectional view taken along line F-F' of the display device of FIG. 10.

FIG. 10 illustrates a schematic plan view of the sub-pixel areas SPXA, the first conductive pattern layer CP1, and the second conductive pattern layer CP2. FIG. 10 illustrates the sub-pixels SPX1, SPX2, and SPX3 (e.g., the light emitting layers EL1, EL2, and EL3) forming the sub-pixel areas SPXA1, SPXA2, and SPXA3, and illustrates the conductive pattern layers CP1 and CP2 formed around the sub-pixel areas SPXA.

FIG. 11 illustrates a top plan view of the display device according to an embodiment, and illustrates the sensing electrodes SP and the separation line SEL.

FIG. 11 does not illustrate the sub-pixels SPX1, SPX2, and SPX3 so that the relationship between the sensing electrodes SP and the separation line SEL is more clearly understood. FIG. 11 may illustrate the same area as FIG. 10, and accordingly, a positional relationship between the sensing electrodes SP and the separation line SEL and the sub-pixels SPX1, SPX2 and SPX3 may be clearly understood.

Referring to FIG. 10, each of the sub-pixels SPX according to an embodiment may be arranged according to a predetermined structure. For example, the sub-pixels SPX may be arranged according to an S-Stripe structure. In the following description, the positional relationship with respect to the sub-pixels SPX1, SPX2, and SPX3 may correspond to the positional relationship with respect to the sub-pixel areas SPXA1, SPXA2, and SPXA3 and/or the light emitting layers EL1, EL2 and EL3.

In an embodiment, the first sub-pixel SPX1 and the second sub-pixel SPX2 may configure a first pixel column COL1. For example, in an embodiment the first sub-pixel SPX1 and the second sub-pixel SPX2 may be sequentially disposed alternately along the first direction DR1. The third sub-pixel SPX3 may not be disposed in the first pixel column COL1, and only the first sub-pixel SPX1 and the second sub-pixel SPX2 may be disposed therein.

In an embodiment, the third sub-pixel SPX3 may configure a second pixel column COL2 adjacent to the first pixel column COL1 (e.g., in the second direction DR2). In an embodiment, the third sub-pixel SPX3 may be sequentially disposed along the first direction DR1. The first sub-pixel SPX1 and the second sub-pixel SPX2 may not be disposed in the second pixel column COL2, and only the third sub-pixel SPX3 may be disposed therein.

In some embodiments, the third sub-pixels SPX3 may be spaced apart from the first area A1 by a first distance, and the other third sub-pixels SPX3 may be spaced apart from the second area A2 adjacent to the first area A1 in the first direction by a second distance greater than the first distance. However, embodiments of the present disclosure are not necessarily limited thereto. In some embodiments, the third sub-pixels SPX3 may be spaced apart from each other at uniform intervals along the first direction DR1.

The first pixel column COL1 and the second pixel column COL2 may be adjacent to each other along the second direction DR2. For example, the first sub-pixel SPX1 may be disposed adjacent to the third sub-pixel SPX3 along the second direction DR2. The second sub-pixel SPX2 may be disposed adjacent to the third sub-pixel SPX3 along the second direction DR2.

In an embodiment, the first pixel column COL1 and the second pixel column COL2 may be alternately arranged along the second direction DR2. For example, the second pixel column COL2 may be disposed between two first pixel columns COL1 (e.g., in the second direction DR2). The first pixel column COL1 may be disposed between two second pixel columns COL2.

The first sub-pixel SPX1 and the second sub-pixel SPX2 adjacent to each other along the first direction DR1 together with the third sub-pixel SPX3 adjacent to the first sub-pixel SPX1 and the second sub-pixel SPX2 along the second direction DR2 may form a pixel unit. For example, the first to third sub-pixels SPX1, SPX2, and SPX3 may form one pixel. The pixels may be sequentially disposed in the first direction DR1 and the second direction DR2.

Referring to FIG. 10 and FIG. 11, according to an embodiment, the first sensing electrode SP1 and the second sensing electrode SP2 may be disposed adjacent to the sub-pixel areas SPXA. For example, the first sensing electrode SP1 and the second sensing electrode SP2 may be spaced apart from each other with respect to the separation line SEL.

The second cell C2 may be spaced apart from the first cell C1 with the separation line SEL interposed therebetween. For example, the (2-1)-th cell (C2-1) and the (2-2)-th cell (C2-2) may be spaced apart from the first bridge BRD1 with the separation line SEL interposed therebetween.

The second conductive pattern layer CP2 may be disposed around the sub-pixel SPX (e.g., the sub-pixel areas SPXA). Referring to FIG. 10, the second conductive pattern layer CP2 may surround at least a portion of the sub-pixel areas SPXA when viewed in a plan view (e.g., viewed from an upper surface). The second conductive pattern layer CP2 may be disposed at the periphery of the sub-pixel SPX to prevent light emission efficiency from being reduced. As a result, it is possible to reduce (e.g., minimize) the deterioration of visibility. Referring further to FIG. 8 and FIG. 9, the light blocking layer LBL and the pixel defining film PDL may be disposed around the sub-pixel SPX. For example, the second conductive pattern layer CP2 may be disposed to overlap the light blocking layer LBL and the pixel defining film PDL (e.g., in a plan view).

According to an embodiment, at least a portion of the second conductive pattern layer CP2 may form a loop (e.g., a closed loop or an open loop) surrounding one or more of the sub-pixel areas SPXA. Accordingly, the second conductive pattern layer CP2 may form a mesh structure. For example, referring to FIG. 10, the second conductive pattern layer CP2 may be disposed to entirely surround the sub-pixels SPX (e.g., in a plan view).

Referring to FIG. 11, the first sensing electrode SP1 and the second sensing electrode SP2 may be spaced apart from each other (e.g., in the second direction DR2) with the separation line SEL interposed therebetween. The second conductive pattern layers CP2 may be electrically separated from each other with the separation line SEL interposed therebetween. Accordingly, different sensing signals may be supplied to the first sensing electrode SP1 and the second sensing electrode SP2.

In an embodiment, at least a portion of the separation line SEL may extend longitudinally along the first direction DR1. The separation line SEL may pass through each of the first sub-pixel SPX1 and the second sub-pixel SPX2. For example, at least a portion of the separation line SEL may extend in the first direction DR1, and may pass through the first sub-pixel SPX1 and the second sub-pixel SPX2 of the first pixel PXL1 and the second pixel PXL2. For example, the separation line SEL may overlap the first sub-pixel SPX1 and the second sub-pixel SPX2 when viewed in a plan view.

In some embodiments, the separation line SEL may not overlap the second bridge BRD2 when viewed in a plan view (e.g., from an upper surface). When viewed in a plan view, the separation line SEL may not overlap an additional bridge BRD2'. For example, one portion of the separation line SEL may be disposed on one side (e.g., a first side in the second direction DR2) of the second bridge BRD2, and the other portion (e.g., a second side in the second direction DR2) of the separation line SEL may be disposed on the other side of the second bridge BRD2.

The second bridge BRD2 may electrically connect the (2-1)-th cell C2-1 to the (2-2)-th cell C2-2. The second bridge BRD2 may include the first conductive pattern layer CP1. The second bridge BRD2 may be electrically connected to the second sensing electrode SP2 through the contact portion CNT.

The second bridge BRD2 may extend longitudinally in a direction in which the (2-1)-th cell C2-1 and the (2-2)-th cell C2-2 are spaced apart from each other. For example, in an embodiment the second bridge BRD2 may extend longitudinally along the second direction DR2. In some embodiments, two or more second bridges BRD2 may be provided to electrically connect adjacent second sensing electrodes SP2 (e.g., the (2-1)-th cell C2-1 and the (2-2)-th cell C2-2) to each other at two or more positions. However, embodiments of the present disclosure are not necessarily limited thereto. In some embodiments, the second bridge BRD2 may extend longitudinally in the first direction DR1, and at least a portion of the second bridge BRD2 may extend longitudinally in the first direction DR1.

In some embodiments, the display device DD may further include an additional bridge BRD2'. The additional bridge BRD2' may be disposed in the area in which the cell C is formed. In an embodiment, the additional bridge BRD2' may be disposed on the same layer as the second bridge BRD2.

The additional bridge BRD2' may have a structure corresponding to the second bridge BRD2. For example, in an embodiment the additional bridge BRD2' may have the same shape or substantially the same shape as the second bridge BRD2 (e.g., in a plan view). The additional bridge BRD2' may have the same length as the second bridge BRD2. The additional bridge BRD2' may have the same width as the second bridge BRD2.

The additional bridge BRD2' may be electrically connected to the second conductive pattern layer CP2 forming the sensing electrodes SP. For example, the additional bridge BRD2' may be electrically connected to the second conductive pattern layer CP2 forming the cell C through an additional contact portion CNT'.

In an embodiment, the additional bridge BRD2' may include a plurality of additional bridges, and a distance at which the plurality of additional bridges are spaced apart from each other in the first direction DR1 may be the same as a distance at which the second bridges BRD2 are spaced apart from each other in the first direction DR1.

Accordingly, a structure corresponding to the second bridge BRD2 may be entirely formed in the sensing area SA. In this embodiment, similar to an embodiment in which the second bridge BRD2 is not formed at a local position but is entirely disposed in the sensing area SA, the risk of visibility deterioration may be reduced.

The second bridge BRD2 may pass between the third sub-pixels SPX3 adjacent to each other (e.g., in the first direction DR1). For example, at least another portion of the second bridge BRD2 may be disposed between the third sub-pixels SPX3 adjacent to each other (e.g., in the first direction DR1). Referring to FIG. 10 and FIG. 14, in an embodiment the second bridge BRD2 may be disposed between the third sub-pixel SPX3 indicated by B and the third sub-pixel SPX3 indicated by BO among the third sub-pixels SPX3 (e.g., in the first direction DR1).

In an embodiment, the second bridge BRD2 may not pass between the first sub-pixel SPX1 and the second sub-pixel SPX2 (e.g., in the first direction DR1). For example, the second bridge BRD2 may not be disposed between the first sub-pixel SPX1 and the second sub-pixel SPX2 (e.g., in the first direction DR1).

In an embodiment, referring to FIG. 10, a valley bridge VBRD may be disposed in an area between sub-pixels adjacent to each other in the first direction DR1.

Figure 15:
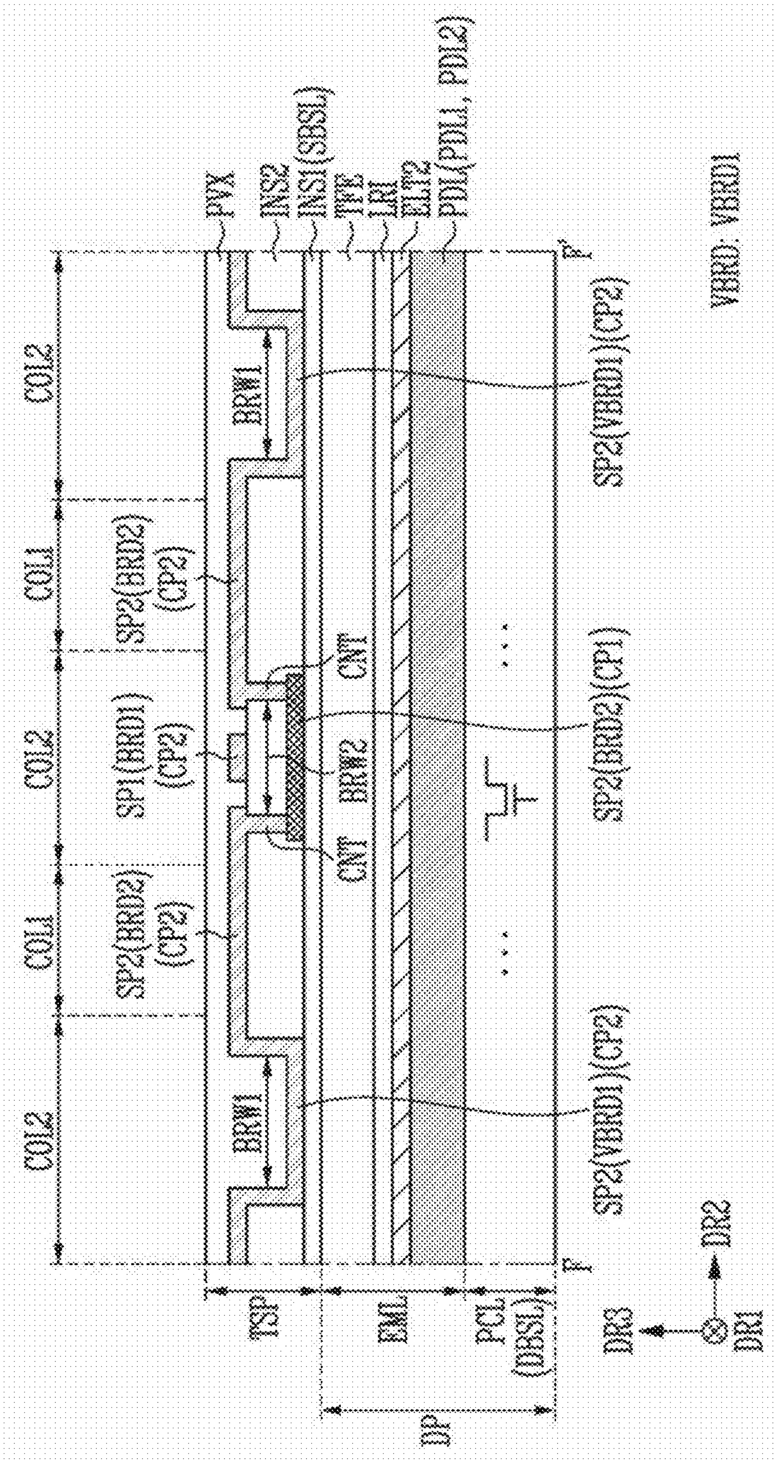
FIG. 15 illustrates a cross-sectional view taken along line F-F' of the display device of FIG. 10 according to an embodiment of the present disclosure.

For example, referring to FIG. 15, a first valley bridge VBRD1 may be disposed in an area between the third sub-pixels SPX3 adjacent to each other in the first direction DR1. In an embodiment, the first valley bridge VBRD1 may be disposed between the third sub-pixels SPX3 adjacent to each other in the first direction DR1, but may be disposed in an area in which a second bridge BRD2 and an additional bridge BRD2' are not disposed. The first valley bridge VBRD1 may be disposed in the second pixel column COL2. In an embodiment, the valley bridge VBRD may correspond to the second bridge BRD2.

The valley bridge VBRD may be disposed in an area from which at least a portion of the second insulating layer INS2 is removed. In an embodiment, the valley bridge VBRD may be in direct contact with an upper surface of the first insulating layer INS1. However, embodiments of the present disclosure are not necessarily limited thereto. For example, the valley bridge VBRD may be disposed in an area in which at least a portion of the second insulating layer INS2 is removed, but may be disposed on (e.g., disposed directly thereon) the second insulating layer INS2 while being spaced apart from the first insulating layer INS1.

In an embodiment, the valley bridge VBRD may include the second conductive pattern layer CP2. The valley bridge VBRD may be included in one of the first sensing electrode SP1 and the second sensing electrode SP2 depending on the position thereof. For example, referring to FIG. 15, the first valley bridge VBRD1 is shown as being included in the second sensing electrode SP2. However, embodiments of the present disclosure are not necessarily limited thereto and the first valley bridge VBRD1 may be included in the first sensing electrode SP1 depending on the position thereof.

In an embodiment, the width of the first valley bridge VBRD1 may be the same as or similar to that of the second bridge BRD2. For example, referring to FIG. 15, the width of the first valley bridge VBRD1 (e.g., in the second direction DR2) may be a first bridge width BRW1, and the width of the second bridge BRD2 (e.g., in the second direction DR2) may be a second bridge width BRW2. Here, the second bridge width BRW2 may correspond to a distance between the contact portions CNT adjacent to each other in the second direction DR2.

Referring to FIG. 15, the first bridge width BRW1 and the second bridge width BRW2 may be equal to or similar to each other. Accordingly, even in an area in which the second bridge BRD2 and the additional bridge BRD2' are not disposed between the adjacent third sub-pixels SPX3, the first valley bridge VBRD1 of a similar shape thereto is disposed, so that the overall reflectance of the display device DD becomes similar, thereby increasing visibility.

In an embodiment, the thickness of the first valley bridge VBRD1 in the third direction DR3 may be the same as or similar to that of the second bridge BRD2 configured of the first conductive pattern layer CP1 in the third direction DR3. However, embodiments of the present disclosure are not necessarily limited thereto.

In an embodiment, the passivation layer PVX may cover the valley bridge VBRD. The second insulating layer INS2 may cover the second bridge BRD2.

Referring further to FIG. 11, the valley bridge VBRD may be disposed to overlap the first bridge BRD1 (e.g., in a plan view). In an embodiment, the valley bridge VBRD may be included in at least one of the (1-1)-th cell C1-1, the (1-2)-th cell C1-2, the (2-1)-th cell C2-1, and the (2-2)-th cell C2-2.

In an embodiment, referring to FIG. 13 and FIG. 14, the second bridge BRD2 may be disposed to overlap the pixel defining film PDL having a relatively large width along the first direction DR1. For example, in an embodiment the pixel defining film PDL may include a first pixel defining film PDL1 having a first width W1 (e.g., length in the first direction DR1) and a second pixel defining film PDL2 having a second width W2 (e.g., length in the first direction DR1). In an embodiment, the second width W2 may be greater than the first width W1. In some embodiments, the first width W1 and the second width W2 may be respective widths of the first pixel defining film PDL1 and the second pixel defining film PDL2 in the first direction DR1. Accordingly, the separation distance between the light emitting layers EL in the first pixel column COL1 may be less than that between the light emitting layers EL in the second pixel column COL2.

In an embodiment, each of the first pixel defining film PDL1 and the second pixel defining film PDL2 may be formed as a portion of the pixel defining film PDL. The first pixel defining film PDL1 and the second pixel defining film PDL2 may be spaced apart from each other in the second direction DR2. For example, the first pixel defining film PDL1 and the second pixel defining film PDL2 may be spaced apart from each other in a direction different from the direction in which the first sub-pixel SPX1 and the second sub-pixel SPX2 are spaced apart from each other. The first pixel defining film PDL1 and the second pixel defining film PDL2 may be spaced apart from each other in the same direction as the direction in which each of the first sub-pixel SPX1 and the second sub-pixel SPX2 is spaced apart from the third sub-pixel SPX3 (e.g., the second direction DR2). The first pixel defining film PDL1 may overlap the first sub-pixel SPX1 and the second sub-pixel SPX2 along the first direction DR1. The second pixel defining film PDL2 may overlap the third sub-pixel SPX3 along the first direction DR1.

In some embodiments, the second bridge BRD2 may be selectively disposed on the second pixel defining film PDL2 having a relatively large width. In some embodiments, the first valley bridge VBRD1 may be selectively disposed on the second pixel defining film PDL2. For example, in an embodiment the second bridge BRD2 and the first valley bridge VBRD1 may overlap the second pixel defining film PDL2 when viewed in a plan view (e.g., when viewed from an upper surface). Both of the second bridge BRD2 and the first valley bridge VBRD1 may not overlap the first pixel defining film PDL1 when viewed in a plan view.

In the above embodiment, the conductive pattern layers CP1 and CP2 may be entirely disposed in the area in which the pixel defining layer PDL is disposed on a plane, while the edge area EDG of the pixel defining film PDL in which the conductive pattern layers CP1 and CP2 are not disposed may be defined to be larger. Referring to FIG. 14, the edge area EDG of the pixel defining film PDL is an area adjacent (e.g., directly adjacent) to the light emitting layer EL, and may be an area not overlapping the conductive pattern layers CP1 and CP2 when viewed in a plan view.

In comparative embodiments, when the edge area EDG of the pixel defining film PDL is manufactured to be too narrow, light emitted from the light emitting layer EL may be interfered with by the conductive pattern layers CP1 and CP2. However, in the display device DD according to an embodiment of the present disclosure, the second bridge BRD2 may be disposed on the second pixel defining film PDL2 having a relatively large second width W2, but may not be disposed on the first pixel defining film PDL1 having a relatively narrow first width W1. Accordingly, the edge area EDG may be widely secured. Accordingly, the risk of occurrence of a light blocking phenomenon in which the path of the emitted light is covered by the conductive pattern layers CP1 and CP2 may be reduced. Accordingly, the light emission efficiency of the display device DD may be increased, and a display device DD with increased visibility may be provided. For example, since the viewing angle of the light emitting layer EL may be determined relatively freely, the degree of freedom in process design of the display device DD may be increased.

In some embodiments, the second bridge BRD2 and the valley bridge VBRD may have a structure substantially extending longitudinally in one direction (e.g., the second direction DR2) when viewed in a plan view. In some embodiments, the second bridge BRD2 and the valley bridge VBRD may have a linear structure extending in the second direction DR2 rather than a mesh structure. In some embodiments, the second bridge BRD2 and the valley bridge VBRD may have a structure extending in one direction without including a curved area when viewed in a plan view.

In an embodiment, the second bridge BRD2 may connect the contact portion CNT for the second sensing electrode SP2 disposed at one side (e.g., a first side in the second direction DR2) and the contact portion CNT for the second sensing electrode SP2 disposed at one side (e.g., a second side in the second direction DR2) with the shortest distance.

In an embodiment, the first valley bridge VBRD1 may connect the second bridge BRD2 of the second sensing electrode SP2 disposed on one side (e.g., a first side in the second direction DR2) and the second bridge BRD2 of the second sensing electrode SP2 disposed on the other side (e.g., a second side in the second direction DR2) with the shortest distance.

Figure 16:
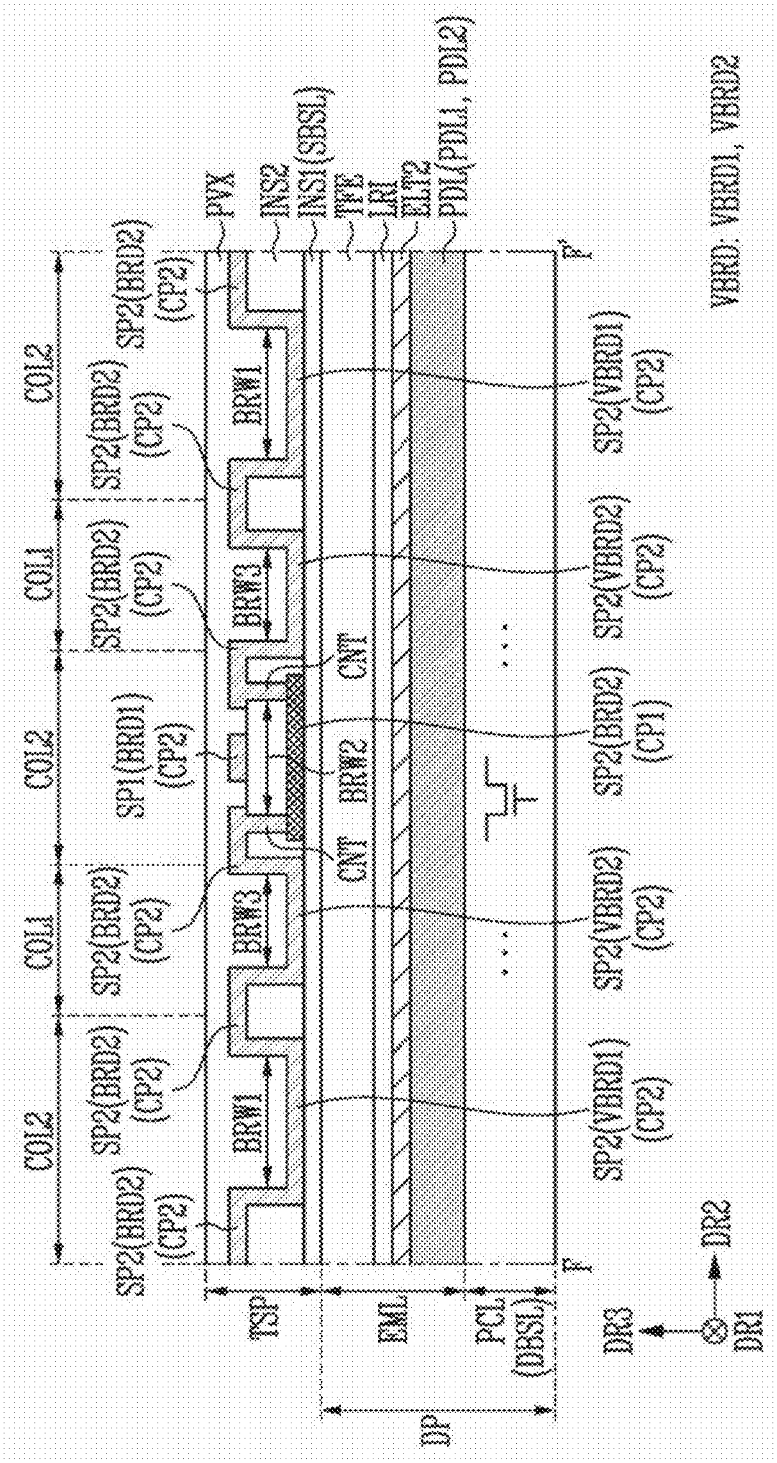
FIG. 16 illustrates another cross-sectional view taken along line F-F' of the display device of FIG. 10 according to an embodiment of the present disclosure.

FIG. 16 illustrates another cross-sectional view taken along line F-F' of the display device of FIG. 10.

Comparing an embodiment of FIG. 16 with an embodiment of FIG. 15 described above, the valley bridge VBRD according to embodiments of the present disclosure may further include a second valley bridge VBRD2. The features of the remaining components may be configured to be the same as or similar to an embodiment of FIG. 15, so a repeated description thereof may be omitted for economy of explanation.

Referring to FIG. 10 and FIG. 16, the display device DD according to embodiments of the present disclosure may include a second valley bridge VBRD2. In an embodiment, the second valley bridge VBRD2 may be disposed in an area between the first sub-pixel SPX1 and the second sub-pixel SPX2, which are adjacent to each other in the first direction DR1.

The second valley bridge VBRD2 may be disposed between the first valley bridge VBRD1 and the second bridge BRD2 (e.g., in the second direction DR2). For example, in an embodiment the second valley bridge VBRD2 may be disposed adjacent to the first valley bridge VBRD1 in the second direction DR2. When viewed in a plan view (e.g. when viewed from an upper surface), the second valley bridge VBRD2 may be disposed adjacent to the second bridge BRD2 in the second direction DR2.

The second valley bridge VBRD2 may include the second conductive pattern layer CP2. The second valley bridge VBRD2 may be disposed in the area in which the second insulating layer INS2 is removed.

The second valley bridge VBRD2 may have a third bridge width BRW3 (e.g., length in the second direction DR2). In an embodiment, the third bridge width BRW3 may be less than the first bridge width BRW1 and the second bridge width BRW2. However, embodiments of the present disclosure are not necessarily limited thereto.

In an embodiment, the thickness of the second valley bridge VBRD2 in the third direction DR3 may be the same as or similar to that of the first valley bridge VBRD1 in the third direction DR3. In an embodiment, the thickness of the second valley bridge VBRD2 in the third direction DR3 may be the same as or similar to that of the second bridge BRD2 in the third direction DR3.

Figure 17:
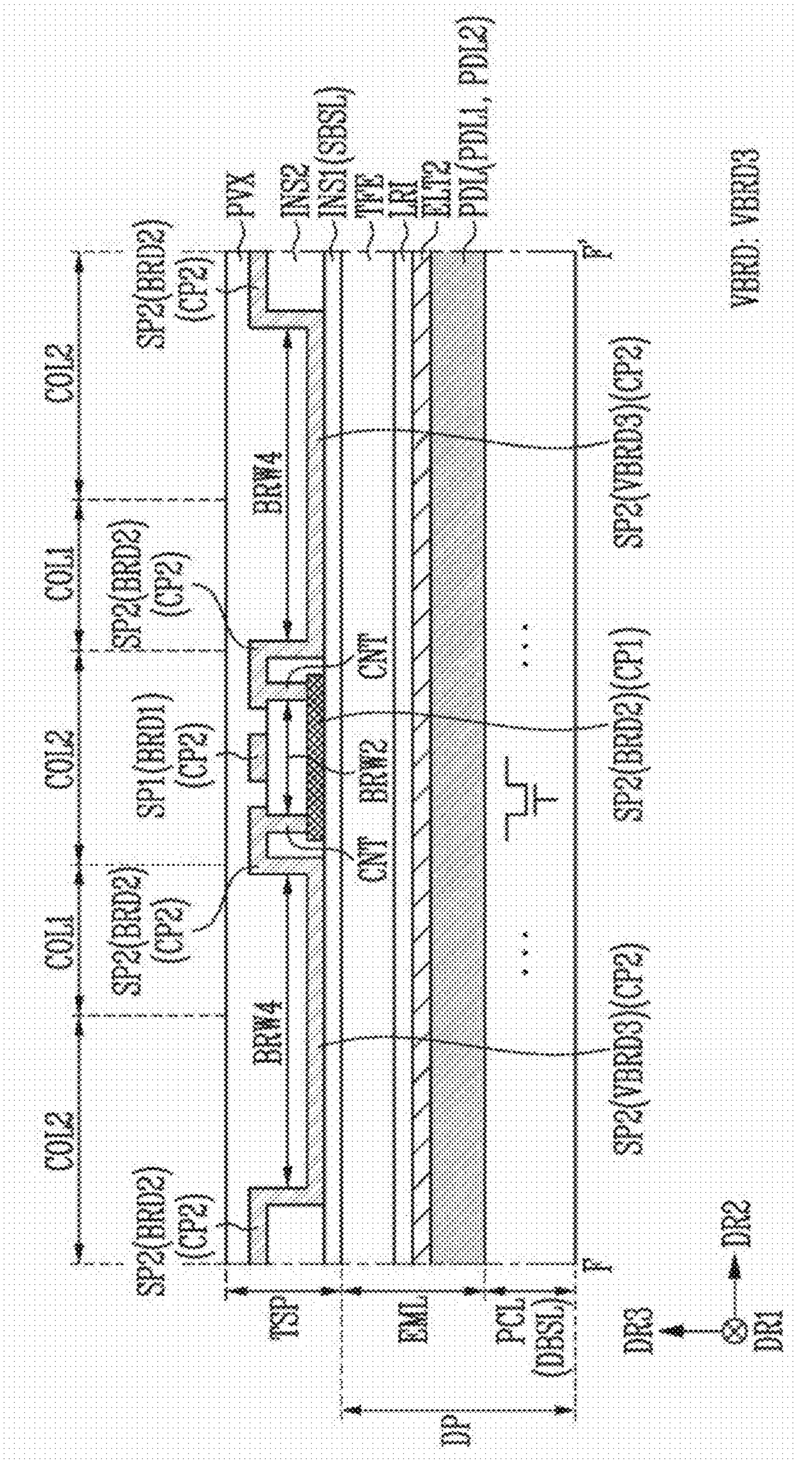
FIG. 17 illustrates another cross-sectional view taken along line F-F' of the display device of FIG. 10 according to an embodiment of the present disclosure.

FIG. 17 illustrates another cross-sectional view taken along line F-F' of the display device DD of FIG. 10.

Comparing an embodiment of FIG. 17 with an embodiment of FIG. 15 and an embodiment of FIG. 16, the valley bridge VBRD may include a third valley bridge VBRD3 having a greater width than the first valley bridge VBRD1 and the second valley bridge VBRD2.

Referring to FIG. 10 and FIG. 17, the display device DD according to embodiments of the present disclosure may include a third valley bridge VBRD3. In an embodiment, the third valley bridge VBRD3 may be disposed in an area between the first sub-pixel SPX1 and the second sub-pixel SPX2, which are adjacent to each other in the first direction DR1. The third valley bridge VBRD3 may be disposed in an area between the third sub-pixels SPX3 adjacent to each other in the first direction DR1.

In an embodiment, the third valley bridge VBRD3 may be disposed adjacent to the second bridge BRD2 in the second direction DR2.

In an embodiment, the third valley bridge VBRD3 may include the second conductive pattern layer CP2. The third valley bridge VBRD3 may be disposed in the area from which the second insulating layer INS2 is removed.

The third valley bridge VBRD3 may have a fourth bridge width BRW4. In an embodiment, the fourth bridge width BRW4 may be greater than the second bridge width BRW2. However, embodiments of the present disclosure are not necessarily limited thereto.

In an embodiment, the thickness of the third valley bridge VBRD3 in the third direction DR3 may be the same as or similar to that of the second bridge BRD2 in the third direction DR3.

Figure 18:
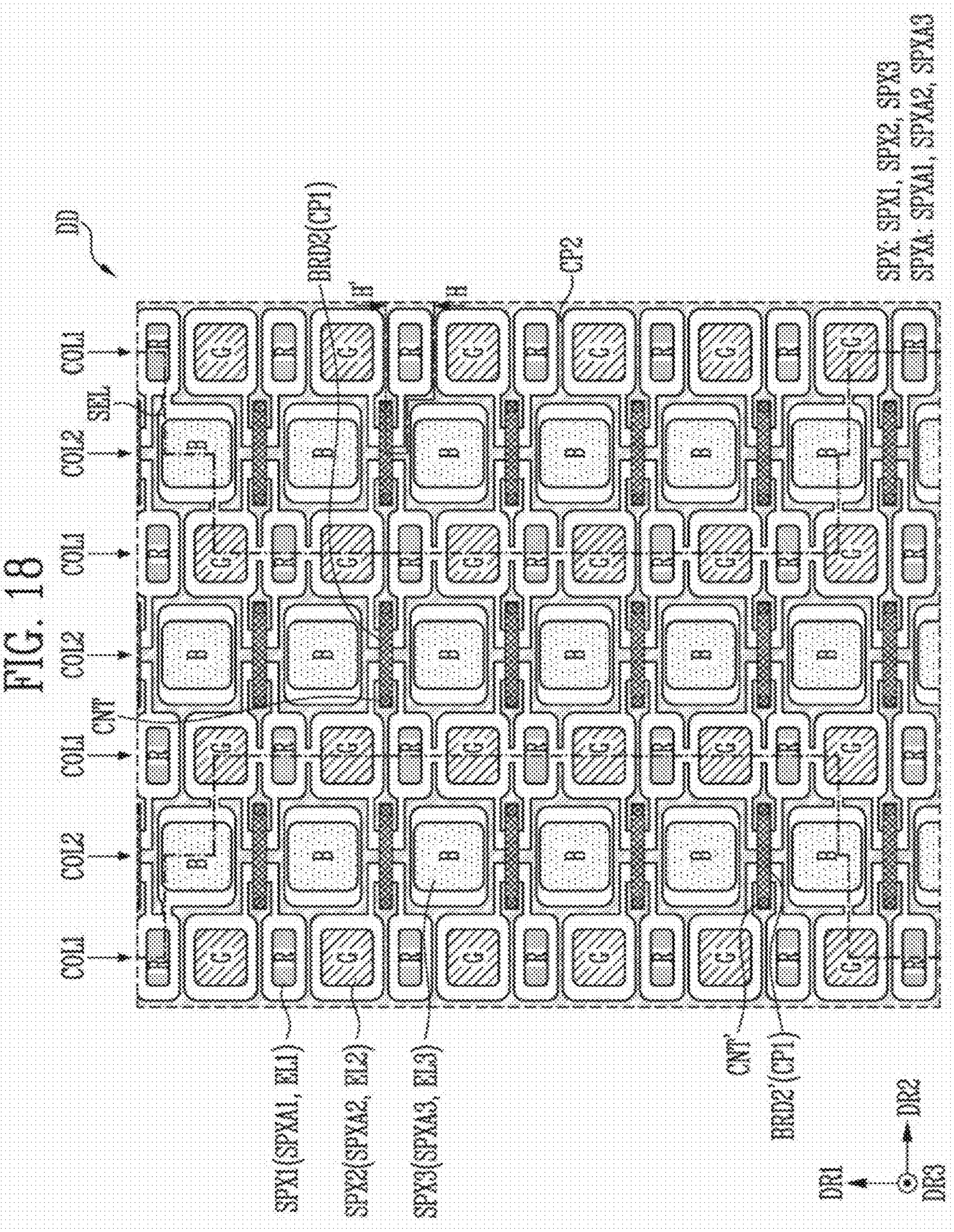
FIG. 18 illustrates a schematic top plan view of a display device according to an embodiment of the present disclosure.
Figure 19:
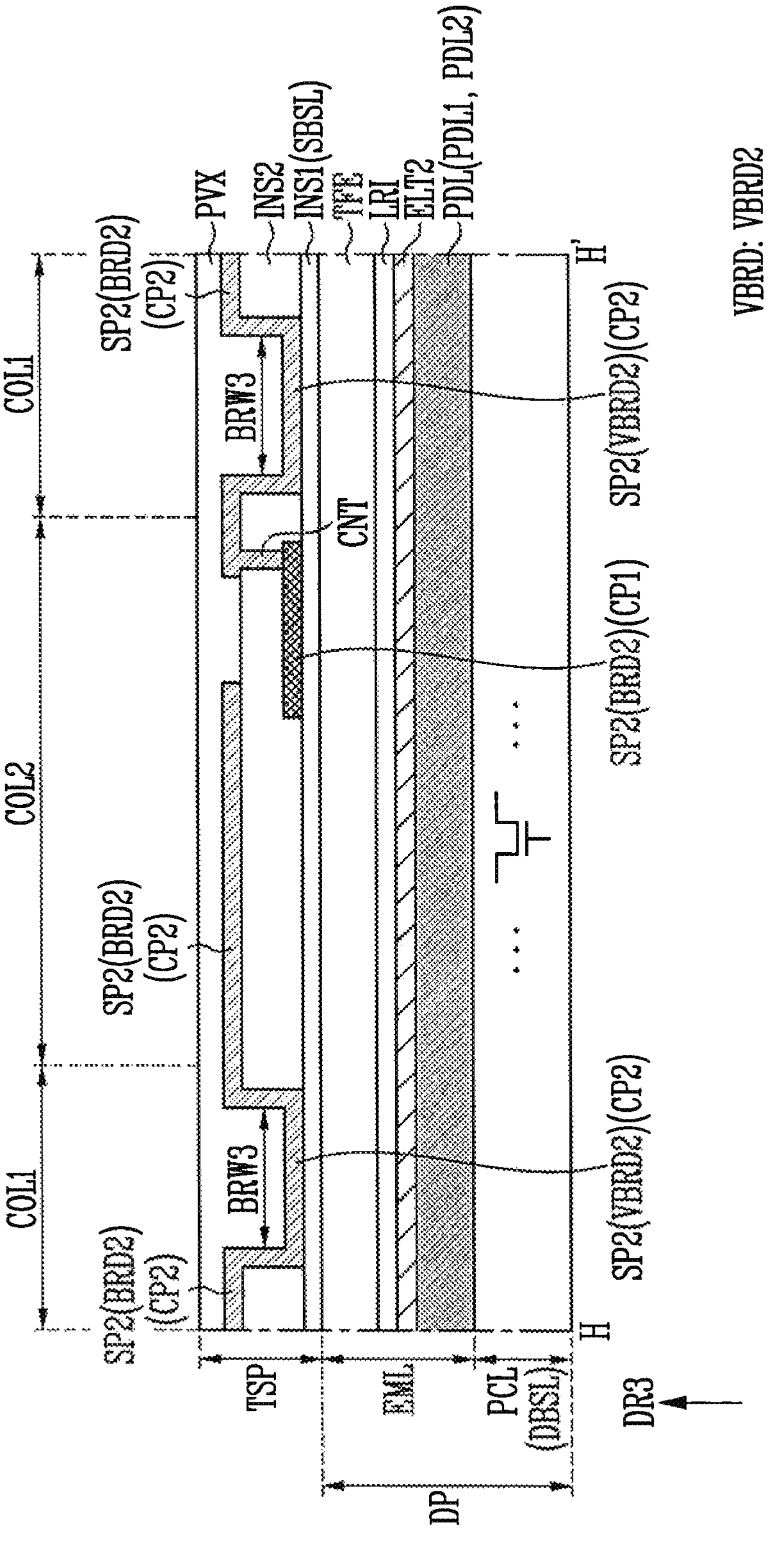
FIG. 19 illustrates a cross-sectional view taken along line H-H' of the display device of FIG. 18 according to an embodiment of the present disclosure.

FIG. 18 illustrates a schematic top plan view of a display device DD according to an embodiment. FIG. 19 illustrates a cross-sectional view taken along line H-H' of the display device of FIG. 18.

Comparing an embodiment of FIG. 18 with an embodiment of FIG. 10 described above, in the display device DD according to an embodiment of FIG. 18, the second bridge BRD2 or the additional bridge BRD2' may be disposed between the third sub-pixels SPX3 adjacent to each other in the first direction DR1.

Referring to FIG. 19, in the display device DD according to an embodiment of the present disclosure, the second valley bridge VBRD2 may be disposed in areas adjacent to the first sub-pixel SPX1 in the first direction DR1 among areas surrounding the first sub-pixel SPX1. Here, the second valley bridge VBRD2 may be understood similarly to the second valley bridge VBRD2 in FIG. 16 described above.

According to embodiments of FIG. 18 and FIG. 19, an area in which the first sub-pixel SPX1 having the smallest emission area is covered by the second conductive pattern layer CP2 may be reduced. Accordingly, color deviation according to the viewing angle may be reduced. Accordingly, the display device DD with increased visibility and excellent display quality may be provided.

Figure 20:
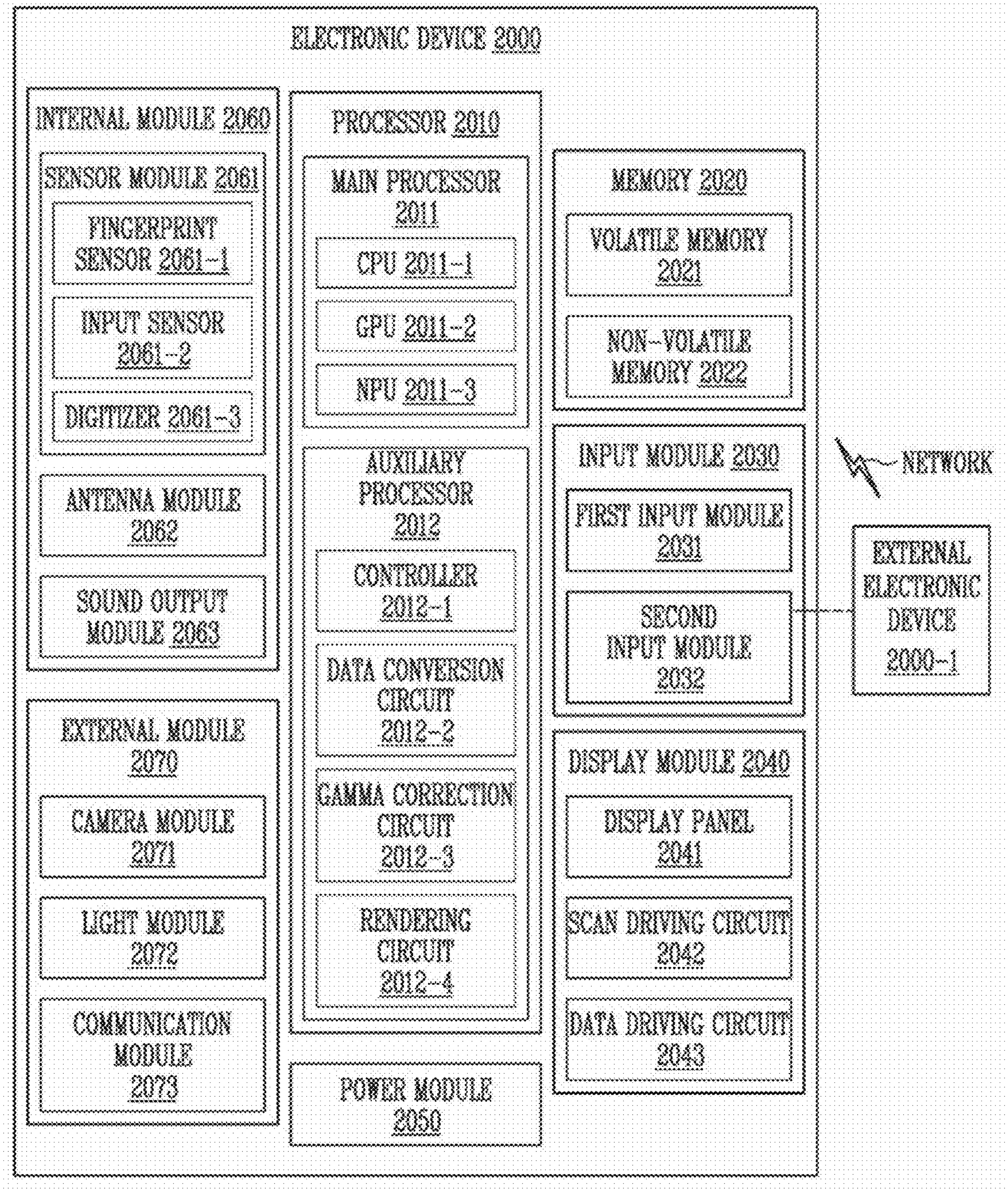
FIG. 20 illustrates a block diagram of an electronic device according to an embodiment of the present disclosure.

FIG. 20 illustrates a block diagram of an electronic device 2000 according to an embodiment of the present disclosure.

The electronic device 2000 may output various information through a display module 2040 in an operating system. When a processor 2010 executes an application stored in a memory 2020, the display module 2040 may provide application information to a user of the electronic device 2000 through a display panel 2041.

In an embodiment, when personal information authentication is executed in the display module 2040, a fingerprint sensor 2061-1 may obtain inputted fingerprint information as input data. The processor 2010 may compare the inputted data obtained through the fingerprint sensor 2061-1 with authentication data stored in the memory 2020, and may execute an application according to the compared result. The display module 2040 may display information executed according to application logic through the display panel 2041.

In an embodiment, when a music streaming icon displayed on the display module 2040 is selected, the processor 2010 may obtain user input through the input sensor 2061-2 and activate a music streaming application stored in the memory 2020. When a music execution instruction is inputted from the music streaming application, the processor 2010 may activate a sound output module 2063 to provide sound information corresponding to the music execution instruction to the user.

In the above, the operation of the electronic device 2000 has been briefly described. Hereinafter, the configuration of the electronic device 2000 will be described in more detail. Some of components of the electronic device 2000 to be described later may be integrated and provided as one component, and one component thereof may be divided and provided as two or more components.

Referring to FIG. 20, the electronic device 2000 may communicate with an external electronic device 2000-1 through a network (e.g., a short range wireless communication network or a long range wireless communication network). According to an embodiment, the electronic device 2000 may include the processor 2010, the memory 2020, an input module 2030, the display module 2040, a power module 2050, an internal module 2060, and an external module 2070. According to an embodiment, in the electronic device 2000, at least one of the aforementioned constituent elements may be omitted, or one or more other constituent elements may be added. According to an embodiment, some (e.g., the sensor module 2061, an antenna module 2062, or the sound output module 2063) of the aforementioned constituent elements may be integrated into another constituent element (e.g., the display module 2040).

In an embodiment, the processor 2010 may execute software to control at least one other constituent element (e.g., a hardware or software constituent element) of the electronic device 2000 connected to the processor 2010, and may perform various data processing or calculations. According to an embodiment, as at least some of the data processing or operation, the processor 2010 may store an instruction or data received from other constituent element (e.g., the input module 2030, the sensor module 2061, or a communication module 2073) in a volatile memory 2021, and may process the instructions or data stored in the volatile memory 2021. The processed result data may be stored in a non-volatile memory 2022.

In an embodiment, the processor 2010 may include a main processor 2011 and an auxiliary processor 2012. The main processor 2011 may include one or more of a central processing unit (CPU) 2011-1 or an application processor (AP). The main processor 2011 may further include one or more of a graphic processing unit (GPU) 2011-2, a communication processor (CP), and an image signal processor (ISP). The main processor 2011 may further include a neural processing unit (NPU) 2011-3. The neural processing unit 2011-3 is a processor specialized in processing an artificial intelligence model, and the artificial intelligence model may be generated through machine learning. The artificial intelligence model may include a plurality of artificial neural network layers. In an embodiment, the artificial neural network may be a deep neural network (DNN), a convolutional neural network (CNN), a deep belief network (DBN), a bidirectional recurrent deep neural network (BRDNN), a deep Q-network, or a combination of two or more thereof. However, embodiments of the present disclosure are not necessarily limited thereto. The artificial intelligence models may additionally or alternatively include a software structure in addition to the hardware structure thereof. At least two of the aforementioned processing unit and processor may be configured as an integrated component (e.g., a single chip), or each thereof may be implemented as an independent component (e.g., a plurality of chips).

In an embodiment, the auxiliary processor 2012 may include a controller 2012-1. The controller 2012-1 may include an interface conversion circuit and a timing controller. The controller 2012-1 may receive an image signal from the main processor 2011, and may convert a data format of the image signal to meet an interface specification with the display module 2040 to output image data. The controller 2012-1 may output various control signals necessary for driving the display module 2040.

In an embodiment, the auxiliary processor 2012 may further include a data conversion circuit 2012-2, a gamma correction circuit 2012-3, a rendering circuit 2012-4, and the like.

The data conversion circuit 2012-2 may receive image data from the controller 2012-1 and it may compensate the image data to display the image with a desired luminance according to characteristics of the electronic device 2000 or a user's setting, or convert the image data to reduce power consumption or compensate for an afterimage.

The gamma correction circuit 2012-3 may convert the image data or gamma reference voltage so that the image displayed on the electronic device 2000 has a desired gamma characteristic. In an embodiment, the rendering circuit 2012-4 may receive image data from the controller 2012-1 and render the image data in consideration of pixel disposition of the display panel 2041 applied to the electronic device 2000. At least one of the data conversion circuit 2012-2 the gamma correction circuit 2012-3, and the rendering circuit 2012-4 may be incorporated into another constituent element (e.g., the main processor 2011 or the controller 2012-1). At least one of the data conversion circuit 2012-2, the gamma correction circuit 2012-3, and the rendering circuit 2012-4 may be integrated into a data driving circuit 2043 to be described later.

The memory 2020 may store various data used by at least one constituent element (e.g., the processor 2010 or the sensor module 2061) of the electronic device 2000, and input data or output data for an instruction related thereto. In an embodiment, the memory 2020 may include at least one or more of the volatile memory 2021 and the non-volatile memory 2022. The processor 2010 may operate by referring to the memory 2020. For example, the processor 2010 may detect a touch input by referring to the memory 2020.

The input module 2030 may receive an instruction or data to be used for a constituent element (e.g., the processor 2010, the sensor module 2061, or the sound output module 2063) of the electronic device 2000 from the outside of the electronic device 2000 (e.g., a user of the electronic device 2000 or the external electronic device 2000-1).

In an embodiment, the input module 2030 may include a first input module 2031 configured to receive an instruction or data inputted from a user of the electronic device 2000, and a second input module 2032 configured to receive an instruction or data inputted from the external electronic device 2000-1. In an embodiment, the first input module 2031 may include at least one of a microphone, a mouse, a keyboard, a key (e.g., a button or the like), and a pen (e.g., a passive pen or an active pen). The second input module 2032 may support a designated protocol that may be connected to the external electronic device 2000-1 by wire or wirelessly. According to an embodiment, the second input module 2032 may include at least one of a high-definition multimedia Interface (HDMI), a universal serial bus (USB) interface, a secure digital (SD) card interface, and an audio interface. The second input module 2032 may include a connector that may physically connect the electronic device 2000 to the external electronic device 2000-1, for example, an HDMI connector, a USB connector, an SD card connector, or an audio connector (e.g., a headphone connector).

The display module 2040 may visually provide information to a user of the electronic device 2000. In an embodiment, the display module 2040 may include the display panel 2041, a scan driving circuit 2042, and the data driving circuit 2043. The display module 2040 may further include a window, a chassis, and a bracket to protect the display module 2040. The display module 2040 may include the display portion DP (see FIG. 1), the display driver DDV (see FIG. 1), and the like described above.

In an embodiment, the display panel 2041 may include a liquid crystal display panel, an organic light emitting display panel, or an inorganic light emitting display panel. However, embodiments of the present disclosure are not necessarily limited thereto and the type of display module 2040 may vary. The display panel 2041 may be of a rigid type. The display panel 2041 may be of a rolling, folding, or stretchable flexible type. In an embodiment, the display module 2040 may further include a supporter, a bracket, or a heat dissipation member for supporting the display panel 2041.

In an embodiment, the scan driving circuit 2042 may be mounted on the display panel 2041 as a driving chip. However, embodiments of the present disclosure are not necessarily limited thereto. In an embodiment, the scan driving circuit 2042 may be integrated into the display panel 2041. For example, the scan driving circuit 2042 includes an amorphous silicon thin film transistor (TFT) gate driver circuit (ASG), a low temperature polycrystalline silicon (LTPS) TFT gate driver circuit, or an oxide semiconductor TFT gate driver circuit (OSG) that is embedded in the display panel 2041. The scan driving circuit 2042 may receive a control signal from the controller 2012-1, and output scan signals to the display panel 2041 in response to the received control signal. The scan driving circuit 2042 may be included in the aforementioned display driver DDV (see FIG. 1).

In an embodiment, the display module 2040 may further include a light emitting driving circuit. The light emitting driving circuit may output a light emitting control signal to the display panel 2041 in response to the control signal received from the controller 2012-1. The light emitting driving circuit may be distinguished from the scan driving circuit 2042, or may be integrated into the scan driving circuit 2042. The light emitting driving circuit may be included in the aforementioned display driver DDV (see FIG. 1).

The data driving circuit 2043 may receive a control signal from the controller 2012-1 and convert image data into an analog voltage (e.g., a data voltage) in response to the received control signal. The data driving circuit 2043 may output the converted data voltage to the display panel 2041. The data driving circuit 2043 may receive a control signal from the controller 2012-1 and sense sub-pixels disposed on the display panel 2041 in response to the received control signal. The data driving circuit 2043 may output digital values corresponding to the sensed sensing values. The data driving circuit 2043 may be included in the above-described display driver DDV (see FIG. 1).

In an embodiment, the data driving circuit 2043 may be integrated with other components of the electronic device 2000 (e.g., the controller 2012-1). At least some of the functions of the interface conversion circuit and the timing controller of the controller 2012-1 may be integrated into the data driving circuit 2043.

The display module 2040 may further include a power supply circuit. The power supply circuit may output various voltages required for driving the display panel 2041. The power supply circuit may correspond to, for example, the power supply circuit described above.

The power module 2050 may supply power to the constituent elements of the electronic device 2000. In an embodiment, the power module 2050 may include a battery in which a power voltage is charged. The battery may include a non-rechargeable primary battery, or a rechargeable battery or fuel cell. The power module 2050 may include a power management integrated circuit (PMIC). The PMIC may supply optimized power to each of the above-described modules and modules to be described later. The power module 2050 may include a wireless power transmission/reception member electrically connected to a battery. The wireless power transmission/reception member may include a plurality of antenna radiators in a form of a coil.

The electronic device 2000 may include the internal module 2060 and the external module 2070. In an embodiment, the internal module 2060 may include the sensor module 2061, the antenna module 2062, and the sound output module 2063. The external module 2070 may include a camera module 2071, a light module 2072, and the communication module 2073.

The sensor module 2061 may detect an input by a user's body or an input by a pen among the first input modules 2031. The sensor module 2061 may generate an electrical signal or a data value corresponding to an input. In an embodiment, the sensor module 2061 may include at least one of the fingerprint sensor 2061-1, the input sensor 2061-2, and a digitizer 2061-3.

The fingerprint sensor 2061-1 may generate a data value corresponding to a user's fingerprint. In an embodiment, the fingerprint sensor 2061-1 may include one of optical type, capacitive type, and ultrasonic type fingerprint sensors. However, embodiments of the present disclosure are not necessarily limited thereto.

The input sensor 2061-2 may generate a data value corresponding to coordinate information of an input by the user's body or an input by the pen. The input sensor 2061-2 may generate an amount of change in capacitance by the input as a data value. In an embodiment, the input sensor 2061-2 may sense input by the passive pen, or may transmit/receive data with the active pen. The input sensor 2061-2 may include the above-described sensor portion TSP (see FIG. 1).

In an embodiment, the input sensor 2061-2 may measure a bio-signal such as blood pressure, water, or body fat. For example, when a user contacts a part of the body on a sensor layer or sensing panel and does not move for a certain period of time, the input sensor 2061-2 may detect a bio-signal based on a change in an electric field caused by the part of the user's body. Accordingly, information on the sensed bio-signal desired by the user may be outputted to the display module 2040.

The digitizer 2061-3 may generate a data value corresponding to coordinate information of a pen input. In an embodiment, the digitizer 2061-3 may generate an electromagnetic change amount by the input as a data value. The digitizer 2061-3 may sense input by the passive pen, or may transmit/receive data with the active pen.

In an embodiment, at least one of the fingerprint sensor 2061-1 the input sensor 2061-2 and the digitizer 2061-3 may be implemented as a sensor layer disposed on the display panel 2041 through successive steps. At least one of the fingerprint sensor 2061-1 the input sensor 2061-2 and the digitizer 2061-3 may be disposed in the upper side of the display panel 2041. One (e.g., the digitizer 2061-3) of the fingerprint sensor 2061-1, the input sensor 2061-2, and the digitizer 2061-3 may be disposed on the lower side of the display panel 2041.

In an embodiment, at least two or more of the fingerprint sensor 2061-1, the input sensor 2061-2, and the digitizer 2061-3 may be formed to be integrated into one sensing panel through the same process. In an embodiment in which such elements are integrated into one sensing panel, the sensing panel may be disposed between the display panel 2041 and a window disposed at the upper side of the display panel 2041. However, embodiments of the present disclosure are not necessarily limited thereto. The sensing panel may be disposed on the window, and the position of the sensing panel is not particularly limited.

In an embodiment, at least one of the fingerprint sensor 2061-1 the input sensor 2061-2 and the digitizer 2061-3 may be embedded in the display panel 2041. In an embodiment, at least one of the fingerprint sensor 2061-1 the input sensor 2061-2 and the digitizer 2061-3 may be simultaneously formed through the process of forming elements (e.g., a light emitting element, a transistor, a capacitor, and the like) included in the display panel 2041.

In addition, the sensor module 2061 may generate an electrical signal or a data value corresponding to an internal state or an external state of the electronic device 2000. In an embodiment, the sensor module 2061 may further include, for example, at least one of a gesture sensor, a gyro sensor, a barometric pressure sensor, a magnetic sensor, an acceleration sensor, a grip sensor, a proximity sensor, a color sensor, an infrared (IR) sensor, a biometric sensor, a temperature sensor, a humidity sensor, and an illuminance sensor.

The antenna module 2062 may include one or more antennas for transmitting or receiving a signal or power to or from the outside (e.g., an external device). According to an embodiment, the antenna module 2062 may transmit a signal to the external electronic device 2000-1 or receive a signal from the external electronic device 2000-1, through an antenna suitable for a communication method. An antenna pattern of the antenna module 2062 may be integrated into one component (e.g., the display panel 2041) of the display module 2040 or the input sensor 2061-2

The sound output module 2063 may be configured to output a sound signal to the outside of the electronic device 2000 (e.g., the external environment). For example, the sound output module 2063 may include a speaker used for general purposes such as multimedia playback or recording playback, and a receiver used exclusively for receiving phone calls. According to an embodiment, the receiver may be provided integrally with or separately from the speaker. A sound output pattern of the sound output module 2063 may be integrated into the display module 2040.

The camera module 2071 may capture still images and/or moving images. According to an embodiment, the camera module 2071 may include one or more lenses, image sensors, or image signal processors. The camera module 2071 may further include an infrared camera capable of measuring the presence or absence of the user, the position of the user, or the gaze of the user.

The light module 2072 may provide light. For example, in an embodiment the light module 2072 may include a light emitting diode or a xenon (Xe) lamp. The light module 2072 may operate in conjunction with the camera module 2071 or may operate independently.

The communication module 2073 may support establishment of a wired or wireless communication channel between the electronic device 2000 and the external electronic device 2000-1, and communication through the established communication channel. In an embodiment, the communication module 2073 may include a wireless communication module and/or a wired communication module. The wireless communication module may include, for example, a cellular communication module, a short-range communication module, or a global navigation satellite system (GNSS) communication module. The wired communication module may include, for example, a local area network (LAN) communication module or a power line communication module. The communication module 2073 may communicate with the external electronic device 2000-1 through a short-range communication network or a long-range communication network. In an embodiment, the short-range communication network may include, for example, Bluetooth® wireless fidelity (Wi-Fi) direct or infringed data association (IrDA). The long-range communication network may include a computer network such as a LAN or a wide area network (WAN). The communication modules 2073 described above may be implemented as a single chip or may be implemented as separate chips.

The input module 2030, the sensor module 2061, the camera module 2071, and the like may be used to control an operation of the display module 2040 in conjunction with the processor 2010.

The processor 2010 may output an instruction or data to the display module 2040, the sound output module 2063, the camera module 2071, or the light module 2072 based on input data received from the input module 2030. For example, in an embodiment the processor 2010 may generate image data in response to input data applied through a mouse or an active pen to output it to the display module 2040, or may generate instruction data in response to the input data to output it to the camera module 2071 or light module 2072. When input data is not received from the input module 2030 for a certain period of time, the processor 2010 may reduce power consumed by the electronic device 2000 by changing an operation mode of the electronic device 2000 to a low power mode or a sleep mode.

The processor 2010 may output an instruction or data to the display module 2040, the sound output module 2063, the camera module 2071, or the light module 2072 based on sensing data received from the sensor module 2061. For example, in an embodiment the processor 2010 may compare authentication data applied by the fingerprint sensor 2061-1 with authentication data stored in the memory 2020 and then execute an application according to the compared result. The processor 2010 may detect whether a touch is present and a touch position based on sensing data detected by the input sensor 2061-2 or the digitizer 2061-3. The processor 2010 may execute an instruction based on sensed data sensed by the input sensor 2061-2 or the digitizer 2061-3, or may output corresponding image data to the display module 2040. In an embodiment in which the sensor module 2061 includes a temperature sensor, the processor 2010 may receive temperature data for a measured temperature from the sensor module 2061, and may further perform luminance correction on image data based on the temperature data. In the embodiment, the processor 2010 may include the sensor driver SDV (see FIG. 1) described above.

In an embodiment, the processor 2010 may receive measurement data about the presence of a user, a user's position, a user's gaze, and the like, from the camera module 2071. The processor 2010 may further perform luminance correction and the like on image data based on the measurement data. For example, the processor 2010 that determines the presence of a user through an input from the camera module 2071 may output image data whose luminance is corrected through the data conversion circuit 2012-2 or the gamma correction circuit 2012-3 to the display module 2040.

The result calculated by the processor 2010 may be stored in the memory 2020.

Some of the constituent elements of the electronic device 2000 may be connected to each other through a communication method between peripheral devices, for example, a bus, a general purpose input/output (GPIO), a serial peripheral interface (SPI), a mobile industry processor interface (MIPI), or an ultra path interconnect (UPI) link to exchange a signal (for example, an instruction or data) with each other. For example, the processor 2010 may communicate with the display module 2040 through a mutually agreed upon interface. To this end, one of the communication methods described above may be adopted. However, embodiments of the present disclosure are not necessarily limited thereto and the communication method may vary.

The electronic device 2000 according to the embodiments of the present disclosure may be devices of various types. For example, the electronic device 2000 may include at least one of a portable communication device, such as a smartphone, a computer device, a portable multimedia device, a portable medical device, a camera, a wearable device, and a home appliance. However, the electronic device 2000 according to embodiments of the present disclosure are not necessarily limited thereto.

While the present disclosure has been described in connection with non-limiting embodiments, it is to be understood that the present disclosure is not limited to the described embodiments, but, on the contrary, is intended to cover various modifications and equivalent arrangements included within the spirit and scope of the present disclosure. Therefore, those skilled in the art will understand that various modifications and other equivalent embodiments of the present disclosure are possible and are within the scope of the present disclosure.

According to the sensing panel, the display device including the same, and the electronic device including the same according to embodiments of the present disclosure, visibility and light emission efficiency may be increased.

What is claimed is:

1. A sensing panel comprising:

a first insulating layer comprising a sensor base layer;

a first conductive pattern layer disposed on the sensor base layer and including a bridge in an area connected to a contact portion;

a second insulating layer disposed on the first conductive pattern layer;

a second conductive pattern layer connected to the first conductive pattern layer in the contact portion and including a valley bridge in an area where the second insulating layer is removed, the valley bridge electrically connecting adjacent patterns of the second conductive pattern layer to each other; and a passivation layer covering the second conductive pattern layer, wherein in an area where the valley bridge is disposed, the second conductive pattern layer is in direct contact with an upper surface of the first insulating layer.

2. The sensing panel of claim 1, wherein:

a width of the valley bridge is a first bridge width, a width of the bridge is a second bridge width; and the first bridge width is equal to the second bridge width.

3. The sensing panel of claim 1, wherein:

the passivation layer covers the valley bridge, and the second insulating layer covers the bridge.

4. The sensing panel of claim 1, wherein:

the second conductive pattern layer comprises a first sensing electrode and a second sensing electrode that are electrically separated from each other; and the first conductive pattern layer comprises the second sensing electrode.

5. The sensing panel of claim 4, wherein:

the first sensing electrode includes the valley bridge.

6. The sensing panel of claim 4, wherein:

the second sensing electrode includes the valley bridge.

7. A display device comprising:

a display panel including a first sub-pixel, a second sub-pixel, and a third sub-pixel; and a sensing panel disposed on the display panel, wherein the sensing panel includes:

a first insulating layer comprising a sensor base layer, the first insulating layer is disposed on the display panel;

a first conductive pattern layer disposed on the sensor base layer and including a bridge in an area connected to a contact portion;

a second insulating layer disposed on the first conductive pattern layer;

a second conductive pattern layer connected to the first conductive pattern layer in the contact portion and including a valley bridge in an area where the second insulating layer is removed, the valley bridge electrically connecting adjacent patterns of the second conductive pattern layer to each other; and a passivation layer covering the second conductive pattern layer, and wherein in an area where the valley bridge is disposed, the second conductive pattern layer is in direct contact with an upper surface of the first insulating layer.

8. The display device of claim 7, wherein:

the first sub-pixel emits red light, the second sub-pixel emits green light, and the third sub-pixel emits blue light;

the first sub-pixel is disposed adjacent to the second sub-pixel in a first direction;

the third sub-pixel is disposed adjacent to each of the first sub-pixel and the second sub-pixel in a second direction; and the first direction and the second directions cross each other.

9. The display device of claim 8, wherein:

the second conductive pattern layer is disposed to entirely surround a peripheral area of each of the first sub-pixel, the second sub-pixel, and the third sub-pixel in a plan view.

10. The display device of claim 8, wherein:

the first sub-pixel and the second sub-pixel are alternately disposed in a first pixel column extending in the first direction, and the third sub-pixel is disposed in a second pixel column disposed adjacent to the first pixel column in the second direction.

11. The display device of claim 10, wherein:

the bridge is disposed adjacent to the third sub-pixel in the first direction.

12. The display device of claim 10, wherein:

the valley bridge is disposed adjacent to the third sub-pixel in the first direction.

13. The display device of claim 10, wherein:

the valley bridge is disposed between the first sub-pixel and the second sub-pixel.

14. The display device of claim 13, wherein:

the valley bridge further extends in the second direction to be disposed adjacent to the third sub-pixel in the first direction.

15. The display device of claim 13, wherein:

an area of the first sub-pixel is less than areas of the second sub-pixel and the third sub-pixel in a plan view; and the valley bridge is disposed adjacent to the first sub-pixel in the first direction.

16. The display device of claim 7, wherein:

the second conductive pattern layer comprises a first sensing electrode and a second sensing electrode that are electrically separated from each other; and the first conductive pattern layer comprises the second sensing electrode.

17. The display device of claim 16, wherein:

the bridge includes:

a first bridge included in the first sensing electrode and including the second conductive pattern layer; and a second bridge included in the second sensing electrode and including the first conductive pattern layer, and the first sensing electrode includes:

the first bridge;

a (1-1)-th cell; and a (1-2)-th cell electrically connected to the (1-1)-th cell through the first bridge, and the second sensing electrode includes:

the second bridge;

a (2-1)-th cell; and a (2-2)-th cell electrically connected to the (2-1)-th cell through the second bridge.

18. The display device of claim 17, wherein:

the valley bridge is disposed to overlap the first bridge in a plan view.

19. The display device of claim 17, wherein:

the valley bridge is included in at least one of the (1-1)-th cell, the (1-2)-th cell, the (2-1)-th cell, and the (2-2)-th cell.

20. An electronic device comprising:

a display module including a bridge and a plurality of sub-pixels, the bridge disposed between a first portion of the plurality of sub-pixels and includes a first conductive layer, and a valley bridge disposed in an area where an insulating layer is removed and between a second portion of the plurality of sub-pixels not including the first portion of the plurality of sub-pixels and includes a second conductive layer, wherein the second conductive layer is disposed on the first conductive layer, the valley bridge electrically connecting adjacent patterns of the second conductive layer to each other;

a memory storing at least one instruction for detecting a touch input; and a processor referring to the memory and detecting a touch position based on sensing data detected through the first conductive layer and the second conductive layer, wherein in an area where the valley bridge is disposed, the second conductive pattern layer is in direct contact with an upper surface of the first insulating layer.

21. The electronic device of claim 20, wherein:

the display module includes:

a display portion having the plurality of sub-pixels disposed therein; and a sensor portion disposed on the display portion and including the first and second conductive layers.

22. The electronic device of claim 20, wherein:

the plurality of sub-pixels include a plurality of first sub-pixels emitting light in a red wavelength band, a plurality of second sub-pixels emitting light in a blue wavelength band, and a plurality of third sub-pixels emitting light in a green wavelength band, and the bridge is disposed between a first portion of the plurality of second sub-pixels.

23. The electronic device of claim 22, wherein:

the valley bridge is disposed between a second portion of the plurality of second sub-pixels not including the first portion of the plurality of second sub-pixels.

24. The electronic device of claim 22, wherein:

the valley bridge is disposed between one of the plurality of first sub-pixels and one of the plurality of third sub-pixels.

25. The electronic device of claim 22, wherein:

a bridge width of the bridge and a bridge width of the valley bridge are equal to each other.

* * * * *